United States Patent [19]
Tanabe

[11] Patent Number: 6,157,053
[45] Date of Patent: *Dec. 5, 2000

[54] CHARGE TRANSFER DEVICE AND METHOD OF DRIVING THE SAME

[75] Inventor: Akihito Tanabe, Tokyo, Japan

[73] Assignee: NEC Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/084,460

[22] Filed: May 26, 1998

[30] Foreign Application Priority Data

May 26, 1997 [JP] Japan .................................. 9-135457

[51] Int. Cl.[7] .................... H01L 27/148; H01L 29/768
[52] U.S. Cl. ..................... 257/239; 257/236; 257/240
[58] Field of Search .................... 257/236, 239, 257/240, 245, 246

[56] References Cited

U.S. PATENT DOCUMENTS

| | | | |
|---|---|---|---|
| 4,350,976 | 9/1982 | Benoit-Gonin et al. ................ | 340/347 |
| 5,416,346 | 5/1995 | Nagakawa et al. ..................... | 257/239 |
| 5,453,783 | 9/1995 | Weir ........................................ | 348/294 |
| 5,477,070 | 12/1995 | Nam ....................................... | 257/239 |

FOREIGN PATENT DOCUMENTS

| | | | |
|---|---|---|---|
| 55-145369 | 11/1980 | Japan ............................ | H01L 29/76 |
| 60-235590 | 11/1985 | Japan ............................ | H04N 5/335 |
| 4-345036 | 12/1992 | Japan ........................... | H01L 21/339 |
| 6-153086 | 5/1994 | Japan ............................ | H04N 5/335 |

OTHER PUBLICATIONS

"Solid– State Image Sensor" published through Shokodo 1986; pp. 73–77.

"Solid–State Imaging with Charge–Coupled Devices" published through Kluwe Academic Publishers; 1995; pp. 76–79.

*Primary Examiner*—Ngân V. Ngô
*Attorney, Agent, or Firm*—Hayes, Soloway, Hennessey, Grossman & Hage, P.C.

[57] ABSTRACT

There is provided a charge transfer device including (a) a charge transfer channel for transferring signal charges therethrough, (b) a floating diffusion region for accumulating therein charges transferred from the charge transfer channel, (c) a field effect transistor for resetting the floating diffusion region so that the floating diffusion region is at a predetermined potential and (d) a bias charge input section through which a bias charge is supplied and which is connected to either the charge transfer channel or the floating diffusion region. The field effect transistor includes a reset gate electrode and a reset drain. The charge transfer channel located below the reset gate electrode is designed to receive either a potential lower than a potential of the reset drain when the floating diffusion region is reset in the case that charges to be transferred are electrons, or a potential higher than a potential of the reset drain when the floating diffusion region is reset in the case that charges to be transferred are holes. The above-mentioned charge transfer device ensures to reset the floating diffusion region regardless of whether a potential in the reset drain is greater or smaller than a potential in a channel located below the reset gate electrode.

61 Claims, 19 Drawing Sheets

6,157,053

CHARGE TRANSFER DEVICE AND METHOD OF DRIVING THE SAME

BACKGROUND OF THE INVENTION

1. Field of the Invention

The invention relates to a charge transfer device to be used for a solid-state image sensor and a delay element, and also to a method of driving the same.

2. Description of the Related Art

A floating diffusion amplifying circuit (FDA) has been widely used as a circuit for detecting signal charges in a charge transfer device. For instance, such a floating diffusion amplifying circuit has been described in "Solid-State Image Sensor" published through Shokodo, 1986, pp. 73–77, and in "Solid-State Imaging with Charge-Coupled Devices" published through Kluwer Academic Publishers, 1995, pp. 76–79.

FIGS. 1A to 1C illustrate a conventional charge transfer device including FDA. The illustrated charge transfer device is of electron-transfer type. FIG. 1A is a top plan view of the charge transfer device, FIG. 1B is a cross-sectional view taken along the line 1B-1B in FIG. 1A, and FIG. 1C illustrates a channel potential at the time when the later mentioned $n^+$ floating diffusion region 211 is reset. As illustrated in FIGS. 1A and 1B, the charge transfer device is comprised of a charge transfer section 218 including first pairs of transfer electrodes 261 and 262, and second pairs of transfer electrodes 271 and 272, first and second pairs of transfer electrodes being alternately arranged in a row, an output gate electrode 208 connected to a final stage of the charge transfer section 218, an $n^+$ floating diffusion region 211, an amplifier 212 for amplifying a voltage in the $n^+$ floating diffusion region 211, a reset gate electrode 209 for resetting the $n^+$ floating diffusion region 211, a reset drain 210 constituted of an $n^+$ diffusion region, and a $p^+$ channel stopper 203 located around the active region where charges are transmitted.

The first and second pairs of transfer electrodes 261, 262, 271 and 272 are formed on an n-type well region 202 formed in a p-type silicon substrate 201 with a silicon dioxide film 205 being sandwiched between the transfer electrodes 261, 262, 271 and 272 and the n-type well region 202. A charge transfer channel is formed in the n-type well 202. An $n^-$ type region 204, namely a region in which n-type impurities are more lightly doped than the n-type well region 202, is formed below every two of the transfer electrodes 262 and 272 to thereby generate a difference in a channel potential.

A pulse voltage $\Phi H1$ is applied to the first pairs of transfer electrodes 261 and 262, and a pulse voltage $\Phi H2$ is applied to the second pairs of transfer electrodes 271 and 272. The pulse voltages $\Phi H1$ and $\Phi H2$ are alternately applied. That is, signal charges are transferred in two-phase drive.

The signal charges transferred to a final stage of the charge transfer channel is further transferred beyond a potential barrier formed below the output gate electrode 208 to the $n^+$ floating diffusion region 211. As a result, a potential in the $n^+$ floating diffusion region 211 varies. The potential in the $n^+$ floating diffusion region 211 is amplified by the amplifier 212, and thereafter is output from the amplifier 212.

After the signal charges have been output in the above-mentioned manner, a potential in the $n^+$ floating diffusion region 211 is reset. The $n^+$ floating diffusion region 211 is reset by applying a high voltage to the reset gate electrode 209 to thereby cause a potential in the charge transfer channel located below the reset gate electrode 209 to be higher than a potential of the reset drain 210 with the result that a potential in the $n^+$ floating diffusion region 211 is equal to a potential in the reset drain 210, as illustrated in FIG. 1C.

As mentioned above, in accordance with the conventional method of resetting the $n^+$ floating diffusion region 211, it is absolutely necessary to cause a charge transfer channel located below the reset gate electrode 209 to have a higher potential than a potential in the reset drain 210 in order to equalize a potential in the $n^+$ floating diffusion region 211 to a potential in the reset drain 210. If a charge transfer channel located below the reset gate electrode 209 had a lower potential than a potential in the reset drain 210, the $n^+$ floating diffusion region 211 is improperly reset, resulting in an increase of noises.

Thus, it is quite important to cause a charge transfer channel located below the reset gate electrode 209 to have a higher potential than a potential in the reset drain 210 in order to properly reset the $n^+$ floating diffusion region 211. Since an external circuit applies a predetermined potential to the reset drain 210, there is almost no fluctuation in a potential in the reset drain 210. On the other hand, a potential in a charge transfer channel located below the reset gate electrode 209 is dependent on impurities profile and/or a dimension of a reset gate. Hence, there tends to generate a dispersion in the potential in a charge transfer channel located below the reset gate electrode 209 due to errors in fabrication of the reset gate electrode 209.

It would be possible to apply a sufficient high voltage to the reset gate electrode 209 with a margin in order to keep a potential in a charge transfer channel located below the reset gate electrode 209 higher than a potential of the reset drain 210 for ensuring that the $n^+$ floating diffusion region 211 is properly reset, even if there would be a dispersion in a potential in a charge transfer channel located below the reset gate electrode 209. However, if an amplitude of a drive voltage was reduced, it would be impossible to ensure an adequate margin, which would result in that the $n^+$ floating diffusion region 211 is improperly reset, and hence, the charge transfer device would have a decreased yield.

SUMMARY OF THE INVENTION

It is an object of the present invention to provide a charge transfer device which is capable of properly resetting a floating diffusion region regardless of whether a potential in a charge transfer channel located below a reset gate electrode is greater or smaller than a potential in a reset drain. It is also an object of the present invention to provide a method of driving such a charge transfer device.

In one aspect, there is provided a charge transfer device including (a) a charge transfer channel for transferring signal charges therethrough, (b) a floating diffusion region for accumulating therein charges transferred from the charge transfer channel, (c) a field effect transistor for resetting the floating diffusion region so that the floating diffusion region is at a predetermined. potential, and (d) a bias charge input section through which a bias charge is supplied and which is connected to one of the charge transfer channel and the floating diffusion region, the field effect transistor including a first reset gate electrode and a reset drain, the charge transfer channel located below the first reset gate electrode being designed to receive a potential lower than a potential of the reset drain when the floating diffusion region is reset in the case that charges to be transferred are electrons, and a potential higher than a potential of the reset drain when the floating diffusion region is reset in the case that charges to be transferred are holes.

It is preferable that the bias charge input section is comprised of an input impurities diffusion region, an input impurities floating diffusion region, a first input gate electrode and a second input gate electrode, the input impurities diffusion region and the input impurities floating diffusion region both being formed in connection with the charge transfer channel, the first input gate electrode being formed above a portion of a substrate sandwiched between the input impurities diffusion region and the input impurities floating diffusion region, and the second input gate electrode being formed above a portion of a substrate located adjacent to the input impurities floating diffusion region.

It is also preferable that the charge transfer device includes an output gate electrode located adjacent to the floating diffusion region, and wherein the bias charge input section is connected to the charge transfer channel in the vicinity of the output gate electrode, in which case, the bias charge input section may be comprised of an input impurity diffusion region, an input impurity floating diffusion region, a first input gate electrode, a second input gate electrode, and a third input gate electrode, the input impurities diffusion region and the input impurities floating diffusion region both being formed in connection with the charge transfer channel, the first input gate electrode being formed above a portion of a substrate sandwiched between the input impurities diffusion region and the input impurities floating diffusion region, the second input gate electrode being formed above a portion of a substrate located adjacent to the input impurities floating diffusion region, and the third input gate electrode being formed adjacent to the second input gate electrode.

It is preferable that a well region in which the charge transfer channel is formed bifurcates, and that the bias charge input section is formed in a bifurcation of the well region, in which case, the charge transfer device may include a plurality of transfer electrodes arranged in a row below which the charge transfer channel is to be formed, and wherein the well region bifurcates at a transfer electrode in the row.

It is preferable that the transfer electrode located at which the well region bifurcates is designed to be larger in size than the other transfer electrodes. It is preferable that the bias charge input section is connected to the floating diffusion region, and wherein the bias charge input section is comprised of an input impurity diffusion region, an input impurity floating diffusion region, a first input gate electrode, a second input gate electrode, a third input gate electrode, and a fourth input gate electrode, the input impurities diffusion region and the input impurities floating diffusion region both being formed in connection with the charge transfer channel, the first input gate electrode being formed above a portion of a substrate sandwiched between the input impurities diffusion region and the input impurities floating diffusion region, the second input gate electrode being formed above a portion of a substrate located adjacent to the input impurities floating diffusion region, the third input gate electrode being formed adjacent to the second input gate electrode, and the fourth input gate electrode being formed adjacent to the third input gate electrode.

The charge transfer device may have a plurality of transfer electrodes arranged in a row below which the charge transfer channel is to be formed, wherein a first pulse voltage is applied to first pairs of transfer electrodes and a second pulse voltage is applied to second pairs of transfer electrodes, the first and second pairs of transfer electrodes being alternately arranged in a row, and wherein a third pulse voltage is applied to third pairs of transfer electrodes and a fourth pulse voltage is applied to fourth pairs of transfer electrodes, the third and fourth pairs of transfer electrodes being alternately arranged in a row, the first, second, third and fourth pairs of transfer electrodes being arranged in a row.

It is preferable that the third pulse voltage has a frequency twice greater than a frequency of the first pulse voltage, and the fourth pulse voltage has a frequency twice greater than a frequency of the third pulse voltage.

The bias charge input section may be comprised of an input impurity diffusion region, an input impurity floating diffusion region, a first input gate electrode, a second input gate electrode, and a third input gate electrode, the input impurities diffusion region and the input impurities floating diffusion region both being formed in connection with the charge transfer channel, the first input gate electrode being formed above a portion of a substrate sandwiched between the input impurities diffusion region and the input impurities floating diffusion region, the second input gate electrode being formed above a portion of a substrate located adjacent to the input impurities floating diffusion region, and the third input gate electrode being formed adjacent to the second input gate electrode.

It is preferable that a well region in which the charge transfer channel is formed bifurcates, and that the bias charge input section is formed in a bifurcation of the well region, in which case, the well region may bifurcate at a transfer electrode to which the fourth pulse voltage is applied.

The transfer electrode located at which the well region bifurcates may be designed to be larger in size than the other transfer electrodes. It is preferable that signal charges are input to the charge transfer channel upstream of the bias charge input section. The bias charge may be input through the bias charge input section to either the charge transfer channel or the floating diffusion region. A sum of the signal charge and the bias charge may be transferred to the floating diffusion region.

It is preferable that the signal charge and the bias charge are concurrently transferred to the floating diffusion region. The signal charge and the bias charge may be alternately transferred to the floating diffusion region. It is preferable that the bias charge has an magnitude sufficient to vary a potential of the floating diffusion region by 40 mV or greater.

There is further provided a charge transfer device including (a) a charge transfer channel for transferring signal charges therethrough, (b) a floating diffusion region for accumulating therein charges transferred from the charge transfer channel, (c) a field effect transistor for resetting the floating diffusion region so that the floating diffusion region is at a predetermined potential, and (d) a bias charge input section through which a bias charge is supplied and which is connected to one of the charge transfer channel and the floating diffusion region, the field effect transistor including a first reset gate electrode, a second reset gate electrode located adjacent to the first reset gate electrode in a direction in which the charges are transferred, and a reset drain, the channel located below at least one of the first and second reset gate electrodes, being designed to receive a potential lower than a potential of the reset drain when the floating diffusion region is reset in the case that charges to be transferred are electrons, and a potential higher than a potential of the reset drain when the floating diffusion region is reset in the case that charges to be transferred are holes.

It is preferable that the first and second reset gate electrodes have the same channel configuration located therebeneath, the same structure of a gate insulating film, and the same impurities profile. Channels located below the first and second reset gate electrodes may have the same potential when the same voltage is applied to the first and second reset gate electrodes. One of channels located below the first and second reset gate electrodes may have a potential having an inclination in a direction in which charges are transferred. One of channels located below the first and second reset gate electrodes may be designed to have a width increasing or decreasing in a direction in which charges are transferred.

A predetermined voltage may be applied to one of the first and second reset gate electrodes, and a voltage switched at a predetermined timing between high and low levels is applied to the other.

A first channel to be formed below the first reset gate electrode may be different in configuration from a second channel to be formed below the second reset gate electrode. A gate insulating film of the first reset gate electrode may be different in structure from a gate electrode film of the second reset gate electrode. An impurity profile below the first reset gate electrode may be different from an impurity profile below the second reset gate electrode. Impurities profile below one of the first and second reset gate electrodes may be designed to vary in a direction in which the charges are transferred. A gate insulating film of one of the first and second reset gate electrodes may be designed to have a thickness increasing or decreasing in a direction in which the charges are transferred.

It is preferable that the charge transfer channel located below one of the first and second reset gate electrodes is designed to have a different potential from a potential of the charge transfer channel located below the other reset gate electrode when the same voltage is applied to the first and second reset gate electrodes. As an alternative, the charge transfer channel located below at least one of the first and second reset gate electrodes may be designed to have a lower potential than a potential of the reset drain when the floating diffusion region is reset in the case that charges to be transferred are electrons, and have a higher potential than a potential of the reset drain when the floating diffusion region is reset in the case that charges to be transferred are holes.

A potential of the reset drain is preferably intermediate between potentials of the charge transfer channels located below the first and second reset gate electrodes, when the floating diffusion region is reset.

It is preferable that a higher level of a pulse voltage to be applied to one of the first and second reset gate electrodes is set higher than a voltage applied to the other in the case that charges to be transferred are electrons, and a lower level of a pulse voltage to be applied to one of the first and second reset gate electrodes is set lower than a voltage applied to the other in the case that charges to be transferred are holes.

It is preferable that channels located below the first and second reset gate electrodes are designed to have different dimensions from each other such that voltages at the channels are different from each other when the same voltage is applied to the first and second reset gate electrodes. It is also preferable that insulating films located below the first and second reset gate electrodes are designed to have different structures from each other such that voltages at the channels are different from each other when the same voltage is applied to the first and second reset gate electrodes. As an alternative, impurity profiles located below the first and second reset gate electrodes may be designed to be different from each other such that voltages at the channels are different from each other when the same voltage is applied to the first and second reset gate electrodes.

In another aspect of the present invention, there is provided a method of driving a charge transfer device including (a) a charge transfer channel for transferring signal charges therethrough, (b) a floating diffusion region for accumulating therein charges transferred from the charge transfer channel, (c) a field effect transistor for resetting the floating diffusion region so that the floating diffusion region is at a predetermined potential, and (d) a bias charge input section through which a bias charge is supplied and which is connected to one of the charge transfer channel and the floating diffusion region, the field effect transistor including at least one reset gate electrode and a reset drain, the charge transfer channel located below the reset gate electrode being designed to receive a potential lower than a potential of the reset drain when the floating diffusion region is reset in the case that charges to be transferred are electrons, and a potential higher than a potential of the reset drain when the floating diffusion region is reset in the case that charges to be transferred are holes, the method including the one of the following steps of (a) transferring a sum of the signal and bias charges to the floating diffusion region, (b) alternately transferring the signal charge and a bias charge to the floating diffusion region, and (c) applying a bias charge to the charge transfer device sufficiently to vary a potential of the floating diffusion region by 40 mV or greater.

The method may further include the step of transferring the signal and bias charges concurrently to the floating diffusion region.

In accordance with the above-mentioned charge transfer device and the method of driving the same, it is possible to properly reset a floating diffusion region, even if there was a fluctuation in a potential in a charge transfer channel located below a reset gate electrode when a floating diffusion region is reset. Hence, it is no longer necessary to unnecessarily make a voltage to be applied to a reset gate electrode higher, which ensures that an amplitude of a drive voltage can be reduced without deterioration of a yield of the charge transfer device.

In addition, since the charge transfer device in accordance with the present invention is simple in structure, a cost for fabricating the charge transfer device can be reduced.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings. In the embodiments explained hereinbelow, electrons are to be transferred as charges.

[First Embodiment]

A charge transfer device in accordance with the first embodiment is explained hereinbelow with reference to FIGS. 2A and 2B.

Figure 1A:
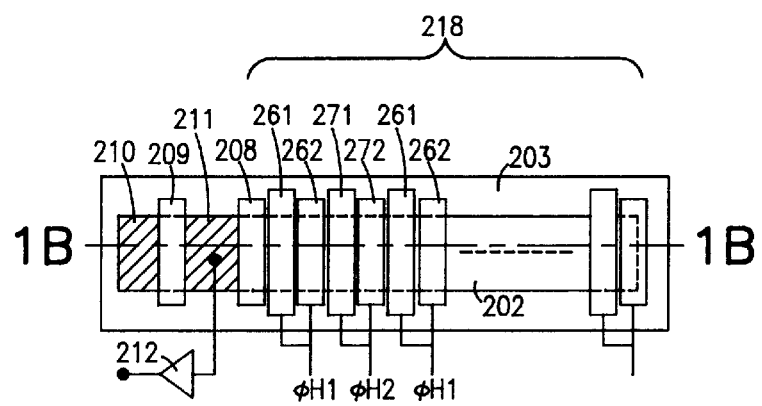
FIG. 1A is a top plan view of a conventional charge transfer device.
Figure 1B:
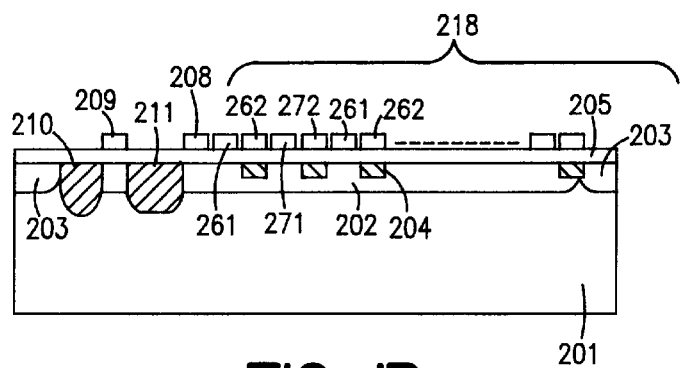
FIG. 1B is a cross-sectional view taken along the line 1B-1B in FIG. 1A.
Figure 1C:
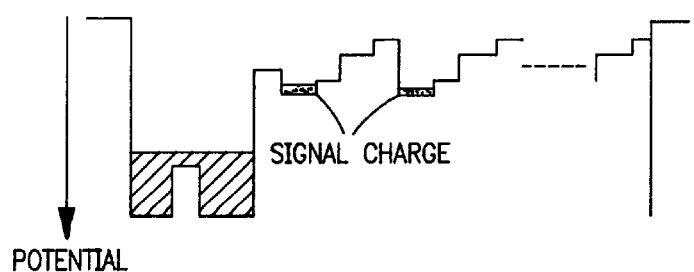
FIG. 1C illustrates a channel potential at the time when an $n^+$ floating diffusion region is reset.
Figures 2A, 2B:
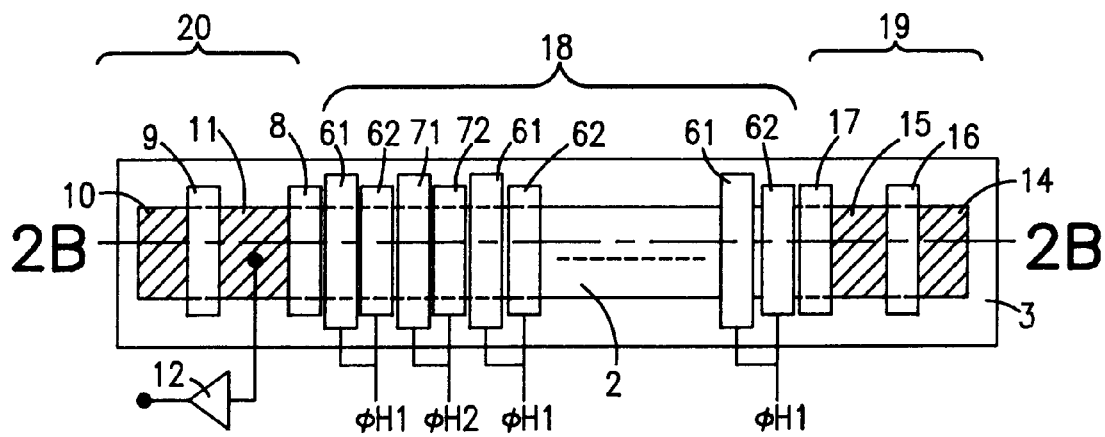
FIG. 2A is a top plan view of a charge transfer device in accordance with the first embodiment of the invention.
FIG. 2B is a cross-sectional view taken along the line 2B-2B in FIG. 2A.

As illustrated in FIGS. 2A and 2B, the charge transfer device is comprised of a charge transfer section 18 including first pairs of transfer electrodes 61 and 62, and second pairs of transfer electrodes 71 and 72. The first and second pairs of transfer electrodes are alternately arranged in a row. The charge transfer device further includes an output gate electrode 8 connected to a final stage of the charge transfer section 18, an $n^+$ floating diffusion region 11, an amplifier 12 for amplifying a voltage in the $n^+$ floating diffusion region 11, a reset gate electrode 9 for resetting the $n^+$ floating diffusion region 11, and a reset drain 10 constituted of an $n^+$ diffusion region. The reset gate electrode 9, the reset drain 10, and the $n^+$ floating diffusion region 11 cooperate with one another to form a field effect transistor 20.

The first and second pairs of transfer electrodes 61, 62, 71 and 72 are formed on an n-type well region 2 formed in a p-type silicon substrate 1 with a silicon dioxide film 5 being sandwiched between the transfer electrodes 61, 62, 71 and 72 and the n-type well region 2. A charge transfer channel is formed in the n-type well 2. An $n^-$ type region 4, namely a region in which n-type impurities are more lightly doped than the n-type well region 2, is formed below every two of the transfer electrodes to thereby generate a difference in a channel potential. In the present embodiment, the $n^-$ type regions 4 are formed below the transfer electrodes 62 and 72.

A pulse voltage $\Phi H1$ is applied to the first pairs of transfer electrodes 61 and 62, and a pulse voltage $\Phi H2$ is applied to the second pairs of transfer electrodes 71 and 72. The pulse voltages $\Phi H1$ and $\Phi H2$ are alternately applied. That is, signal charges are transferred in two-phase drive.

The charge transfer device is further comprised of a bias charge input section 19 through which a bias charge is input, at an opposite end to an output end of the charge transfer device. The bias charge input section 19 is comprised of an input $n^+$ diffusion region 14, a first input gate electrode 16, an input $n^+$ floating diffusion region 15, and a second input gate electrode 17. The input $n^+$ diffusion region 14 and the input $n^+$ floating diffusion region 15 are both formed in the n-type well 2 and the p-type silicon substrate 1. The first input gate electrode 16 is formed on the silicon dioxide film 5 above the n-type well region 2 sandwiched between the input $n^+$ diffusion region 14 and the input $n^+$ floating diffusion region 15, and the second input gate electrode 17 is formed on the silicon dioxide film 5 above the n-type well region 2 and adjacent to the input no floating diffusion region 15. A $p^+$ channel stopper 3 is also formed around the active region where charges are transmitted.

Though a signal charge input section is not illustrated, signal charges are input into the charge transfer channel 18 from a signal charge input section at a location closer to an output end of the charge transfer device than the bias charge input section 19.

Figure 3:
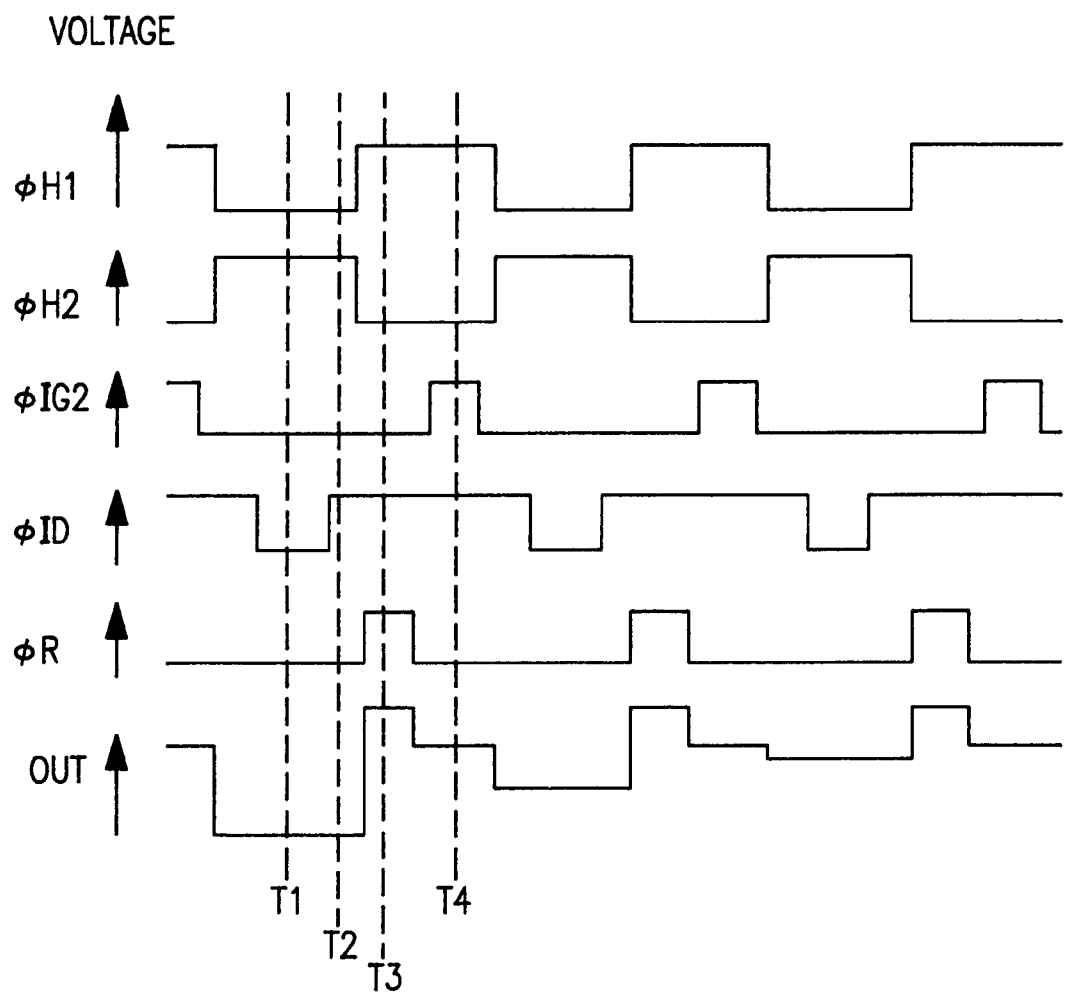
FIG. 3 illustrates pulse voltages to be applied to a charge transfer device in accordance with the first embodiment.

FIG. 3 illustrates pulse voltages used for driving the charge transfer device in accordance with the above-mentioned first embodiment. The pulse voltage $\Phi H1$ is applied to the first pairs of transfer electrodes 61 and 62, the pulse voltage $\Phi H2$ is applied to the second pairs of transfer electrodes 71 and 72, a pulse voltage $\Phi IG2$ is applied to the second input gate electrode (IG2) 17, a pulse voltage $\Phi ID$ is applied to the input $n^+$ diffusion region (ID) 14, and a pulse voltage $\Phi R$ is applied to the reset gate electrode 9. Though not illustrated in FIG. 3, a predetermined voltage is applied to the first input gate electrode 16, the output gate electrode 8, and the reset drain 10. The input $n^+$ floating diffusion region 15 is in a floating condition. A fluctuation in a potential in the $n^+$ floating diffusion region 11 is represented with "OUT".

There are known many methods for inputting bias charges into a charge transfer device. For instance, the above-mentioned book "Solid-State Image Sensor" shows a few examples at pages 70–73. In the present embodiment, bias charges are input into the charge transfer device as follows.

Figure 4:
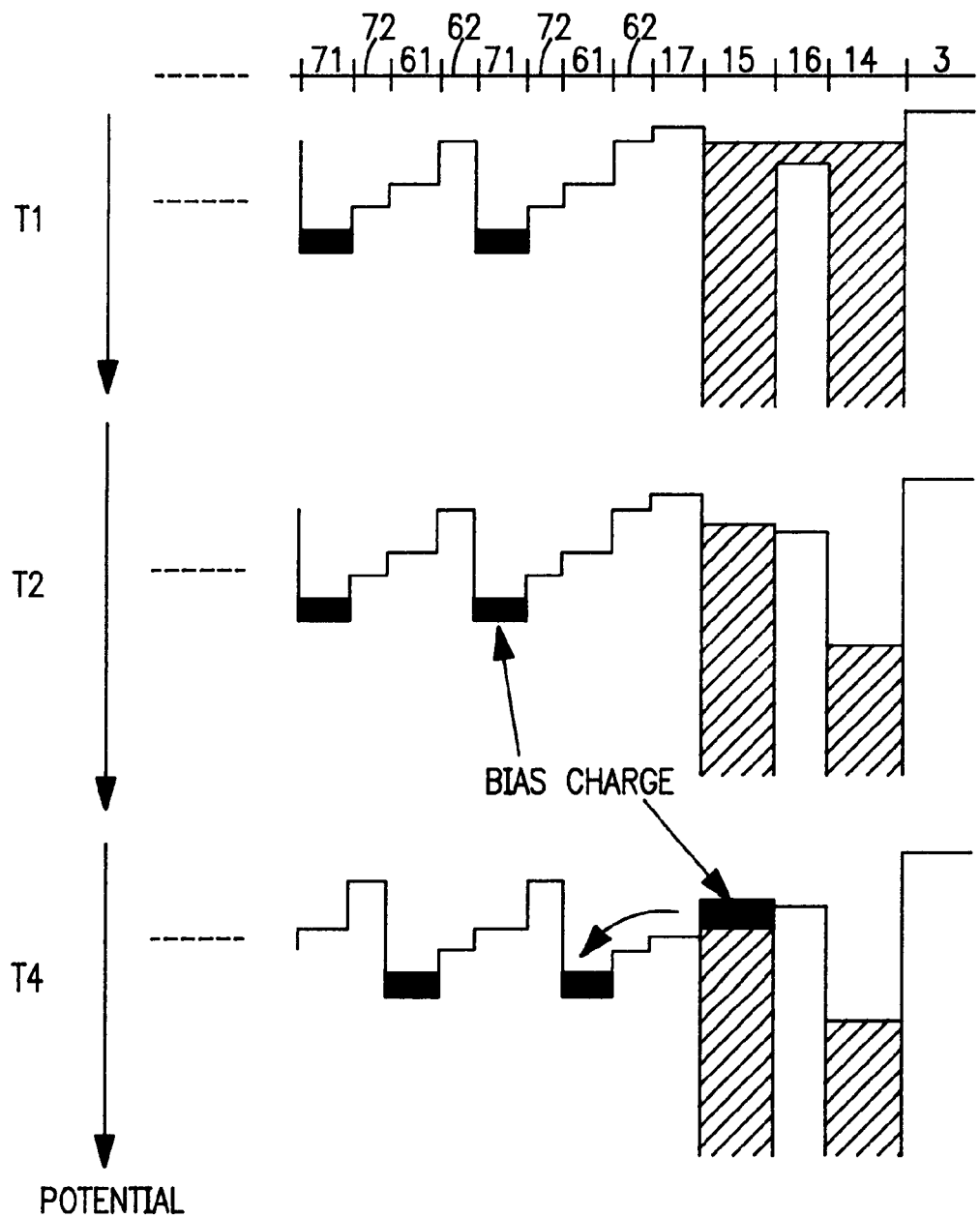
FIG. 4 illustrates a channel potential in the vicinity of a bias charge input section in a charge transfer device in accordance with the first embodiment.

FIG. 4 illustrates potentials in the charge transfer channels in the vicinity of the bias charge input section 19 along the line 2B-2B in FIG. 2 at times T1, T2 and T4 shown in FIG. 3. Numerals shown above the figures of FIG. 4 represent reference numerals indicating the elements of the charge transfer device illustrated in FIGS. 2A and 2B.

At time T1, a potential Φch (IG2) of a charge transfer channel located below the second input gate electrode (IG2) 17 is set smaller than a potential Φch (IG1) of a charge transfer channel located below the first input gate electrode (IG1) 16, and a potential in the input n$^+$ diffusion region (ID) 14 is made intermediate between the potential Φch (IG1) and the potential Φch (IG2) by applying the pulse voltage ΦID thereto. Thus, the input n$^+$ floating diffusion region 15 is charged.

At time T2, the pulse voltage ΦID is made high, and a potential in the input n$^+$ floating diffusion region 15 is made close to the potential Φch (IG1).

At time T4, the pulse voltages ΦIG2 and ΦH1 are made high, and bias charges determined in dependence on a difference between the potentials Φch (IG1) and Φch (IG2) are input to charge transfer channels located below the transfer electrodes 61 to which the pulse voltages ΦH1 are applied. The pulse voltages ΦH1 and ΦH2 applied to the first and second pairs of transfer electrodes 61, 62 and 71, 72, respectively, successively transfer bias charges towards an output end of the charge transfer device. Signal charges are added to the bias charges at a location closer to the output end (a left end in FIG. 4) than the bias charge input section 19, and are transferred to the n$^+$ floating diffusion region 11. Charges are not transferred on the transfer electrodes, but are transferred through the charge transfer channel located below the transfer electrodes.

Figure 5:
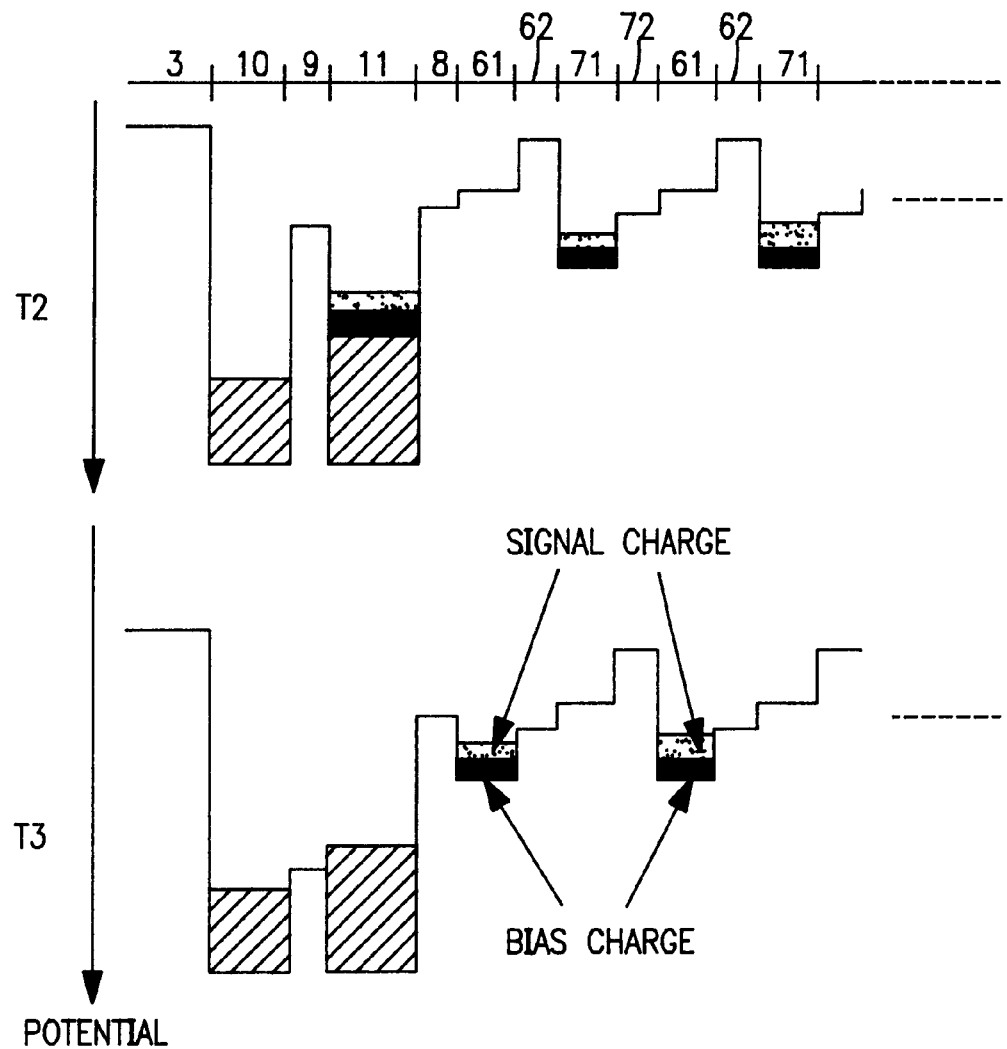
FIG. 5 illustrates a channel potential in the vicinity of a floating, diffusion region in a charge transfer device in accordance with the first embodiment.

Hereinbelow is explained a process of resetting the n$^+$ floating diffusion region 11 with reference to FIG. 5. FIG. 5 illustrates potentials in the charge transfer channels in the vicinity of the n$^+$ floating diffusion region 11 along the line 2B-2B in FIG. 2A at times T2 and T3 shown in FIG. 3. Numerals shown above the figures of FIG. 5 represent reference numerals indicating the elements of the charge transfer device illustrated in FIGS. 2A and 2B.

At time T2, the pulse voltage ΦH1 is made low, and the bias charges and the signal charges having been accumulated in a channel located below the transfer electrodes 61 to which the pulse voltage ΦH1 is applied are transferred to the n$^+$ floating diffusion region 11 through the output gate electrode 8. As a result, a potential in the n$^+$ floating diffusion region 11 fluctuates. The thus fluctuated potential is detected, and is amplified by the amplifier 12. The thus amplified potential is output from the amplifier 12.

As an output signal, there is obtained a signal including an addition brought by the bias charge. It would be easy to subtract the addition from the output signal. If an output signal is in the form of a video signal, it is generally done to offset an output signal, and hence, no problem is caused, even if all addition associated with the bias charge is added to the signal charge.

At time T3, the pulse voltage ΦR is made high, and the reset gate electrode 9 is turned on, to thereby sweep the signal and bias charges into the reset drain 10. At this time, a charge transfer channel located below the reset gate electrode 9 is set to have a potential lower than a potential in the reset drain 10. Hence, a potential in the n$^+$ floating diffusion region 11 does not become equal to a potential in the reset drain 10, but is reset to a potential determined dependent on an amount of charges transferred and a reset time, that is, a period of time in which the pulse voltage ΦR is made high.

Hereinbelow is explained the principle for reset operation. When the n$^+$ floating diffusion region 11 is to be reset, the n$^+$ floating diffusion region 11, the reset gate electrode 9, and the reset drain 10 cooperate to one another to act as MOS field effect transistor (FET) 20. Herein, the n$^+$ floating diffusion region 11 acts as a source, the reset gate electrode 9 acts as a gate, and the reset drain 10 acts as a drain. The source is in a floating condition.

Immediately after the reset gate electrode 9 has been turned on at time T3, charges having been transferred to the n$^+$ floating diffusion region 11 are swept to the reset drain 10 in accordance with a saturation region characteristic or linear region characteristic in a drain current-drain voltage characteristic of a transistor, and hence, a potential in the source or the n$^+$ floating diffusion region 11 is increased.

Thereafter, when the potential in the source becomes smaller than a threshold voltage, a drain current is generated in quite a small amount by virtue of a sub-threshold characteristic. Since the drain current is quite small in an amount, the source potential varies at a low rate, and as a result, it takes much time for the source potential to saturate. If a reset time, that is, a period of time in which the reset gate electrode 9 is on, is short, the source potential cannot reach saturation. Accordingly, the source or the n$^+$ floating diffusion region 11 is reset to a potential determined in dependence on a function of an amount of charges transferred and the reset time.

If the reset time is kept constant, a potential at which the source is reset is determined dependent on an amount of charges transferred to the source. If the reset potential varies in dependence on an amount of signal charges transferred to the source, the n$^+$ floating diffusion region 11 may not be properly reset. Hence, in the present embodiment, a bias charge greater than a predetermined value is applied to the n$^+$ floating diffusion region 11 to ensure that the n$^+$ floating diffusion region 11 is reset to a constant potential. Hereinbelow is explained the principle for resetting the n$^+$ floating diffusion region 11 to a constant potential.

A drain current is kept high until it reaches a sub-threshold region, and a rate at which a source potential varies is greater than the sub-threshold region. Accordingly, a potential at which the source is reset is determined in dependence on the sub-threshold region. A drain current Id when the n$^+$ floating diffusion region 11 is reset is defined with the following equation (A).

$$Id = I_0 \exp(-qVs/kT) = I_0 \exp(-\beta Vs) \quad \beta = q/kT \quad (A)$$

In this equation, q indicates an elementary charge, k indicates Boltzmann's constant, T indicates an absolute temperature, and $I_0$ indicates a factor defined with a dimension of a channel of a gate, a potential in a gate, and mobility of electrons.

A potential Vfd in the n$^+$ floating diffusion region 11 at a time "t" is defined with the following equation (B), suppose that the n$^+$ floating diffusion region 11 has a potential of $V_0$ at t=0, and a capacity of Cfd.

$$Vfd(t, V_0) = (1/\beta) \times \ln\{I_0 \beta t / Cfd + \exp(\beta V_0)\} = (1/\beta) \times \ln\{t/\tau + \exp(\beta V_0)\} \tau = Cfd/\beta I_0 \quad (B)$$

A constant signal charge Vsig1 and bias charge Vbias is successively transferred to the n$^+$ floating diffusion region 11. After the n$^+$ floating diffusion region 11 is reset at a reset time Ton, the n$^+$ floating diffusion region 11 is put in a steady state. A potential Vr at which the n$^+$ floating diffusion region 11 in the steady state is reset is defined with the following equation (C).

$$Vr = Vfd\ (Ton,\ Vr-Vsig1-Vbias) \quad (C)$$

The following equation (D) is obtained on the basis of the equation (C).

$$\exp(\beta Vr) = (Ton/\tau) \times 1/[1-\exp\{-\beta(Vsig1+Vbias)\}] \quad (D)$$

After the n$^+$ floating diffusion region 11 is reset to the potential Vr, if the signal charge Vsig1 is changed into a signal charge Vsig2, a fluctuation $\Delta$Vr in the reset potential is represented with the following equation (E).

$$\Delta Vr = Vfd\ (Ton,\ Vr-Vsig2-Vbias)-Vr = (1/\beta) \times 1n\ [1-\exp\{-\beta(Vsig1+Vbias)\}+\exp\{-\beta(Vsig2+Vbias)\}] \quad (E)$$

Figure 6:
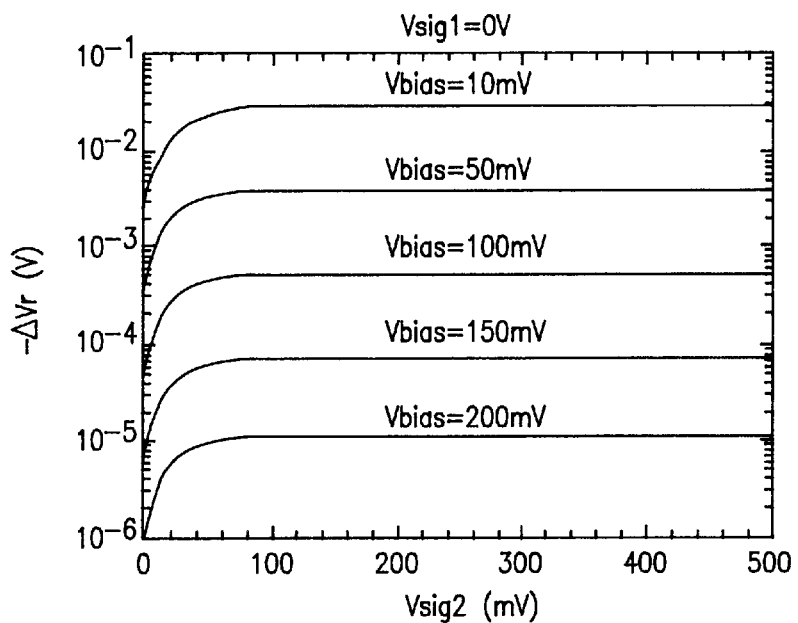
FIG. 6 is a graph showing a relation between signal charges and a reset potential in a charge transfer device in accordance with the first embodiment.

FIG. 6 illustrates a fluctuation in $\Delta$Vr in dependence on the signal charge Vsig2, when Vsig1=0V, with the bias charge Vbias being used as a parameter. It is understood in view of FIG. 6 that as the signal charge Vsig2 is increased, an absolute value of $\Delta$Vr is increased, and is saturated after the signal charge Vsig2 exceeds about 150 mV.

Figure 7:
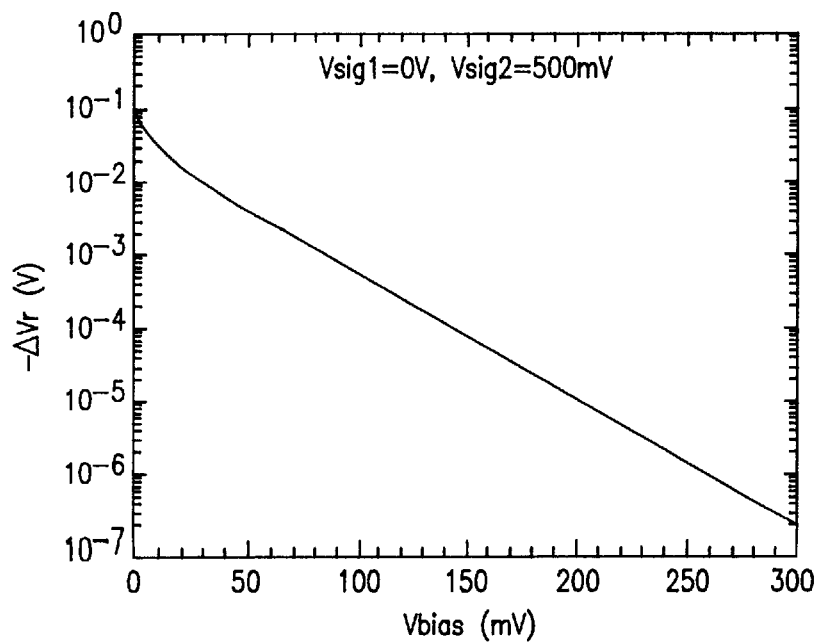
FIG. 7 is a graph showing a relation between bias charges and a reset potential in a charge transfer device in accordance with the first embodiment.

FIG. 7 illustrates $\Delta$Vr, as a function of Vbias, which is saturated under the conditions that Vsig1=0V and Vsig2= 500 mV.

Figure 8:
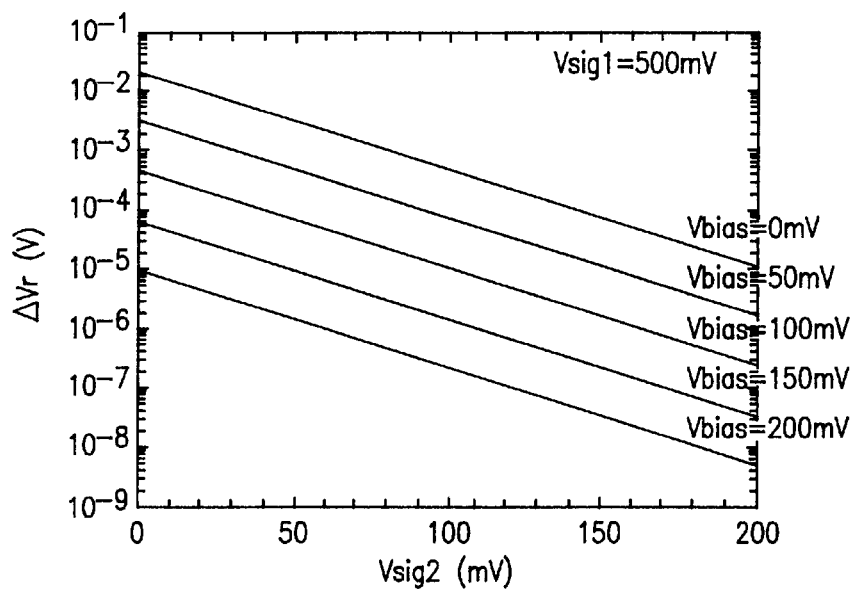
FIG. 8 is a graph showing a relation between signal charges and a reset potential in a charge transfer device in accordance with the first embodiment.

FIG. 8 illustrates a fluctuation in $\Delta$Vr in dependence on the signal charge Vsig2, when Vsig1=500 mV, with the bias charge Vbias being used as a parameter. It is understood that as the signal charge Vsig2 increases, $\Delta$Vr exponentially decreases.

Figure 9:
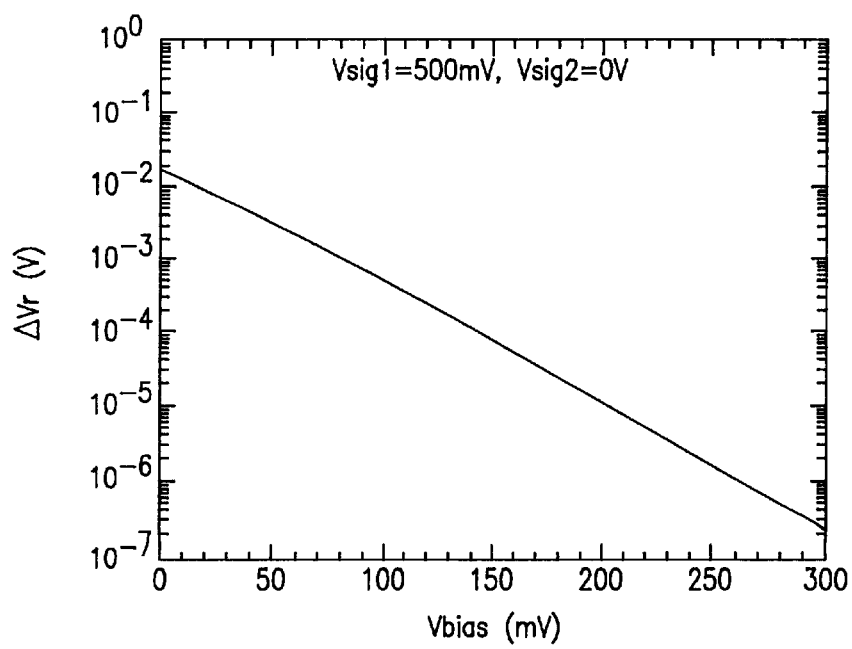
FIG. 9 is a graph showing a relation between bias charges and a reset potential in a charge transfer device in accordance with the first embodiment.

FIG. 9 illustrates $\Delta$Vr, as a function of Vbias, under the conditions that Vsig1=500 mV and Vsig2=0V.

An absolute value of $\Delta$Vr in FIG. 7 is greater than an absolute value of $\Delta$Vr in FIG. 9 in an average, but is almost equal to an absolute value of $\Delta$Vr when the bias charge Vbias is equal to or greater than 100 mV. Absolute values of $\Delta$Vr shown in FIGS. 7 and 9 indicate a dispersion in a reset potential caused by the bias charge Vbias, and a greater one between the absolute values of $\Delta$Vr shown in FIGS. 7 and 9 indicates a maximum value in a dispersion in a reset potential. In view of any one of FIGS. 6 to 9, it is understood that an absolute value of $\Delta$Vr, which indicates a dispersion in a reset potential, is smaller, when the bias charge Vbias is greater.

A dispersion in a reset potential is added to a noise. A conventional process of resetting the n$^+$ floating diffusion region 11 has a reset noise of (kTCfd)$^{1/2}$. This means that when Cfd is equal to 5 fF, a reset noise is equal to 9.1×10$^{-4}$ Vr. m.s.. In view of FIG. 7, when the bias charge Vbias is equal to about 40 mV, a dispersion in a reset potential is almost equal to a peak-to-peak value of conventional reset noise, that is, a difference between maximum and minimum values in a dispersion in a reset potential at a kTC noise. In addition, if the bias charge Vbias is equal to or greater than 100 mV, a dispersion in a reset potential to be newly added by a driving method in accordance with the present invention is merely about one-tenth of a dispersion caused by kTC noise. Hence, an increase in a noise caused by the invention is negligible.

Thus, if a bias charge is applied in an amount greater than a certain value, it is possible to make a dispersion in a reset potential small to a negligible degree. An amount of a bias charge necessary for making a newly added noise small to a negligible degree is dependent on various factors such as Cfd, a rejection ratio of a reset noise by virtue of correlated double sampling, and a magnitude of a noise of an amplifier. If Cfd is equal to or smaller than 1 fF and a bias charge is equal to or greater than 40 mV, a noise newly added by a dispersion in a reset potential is equal to or smaller than 20%. Accordingly, a bias charge to be applied to the charge transfer device is expected to be equal to or greater than 40 mV.

Figure 10:
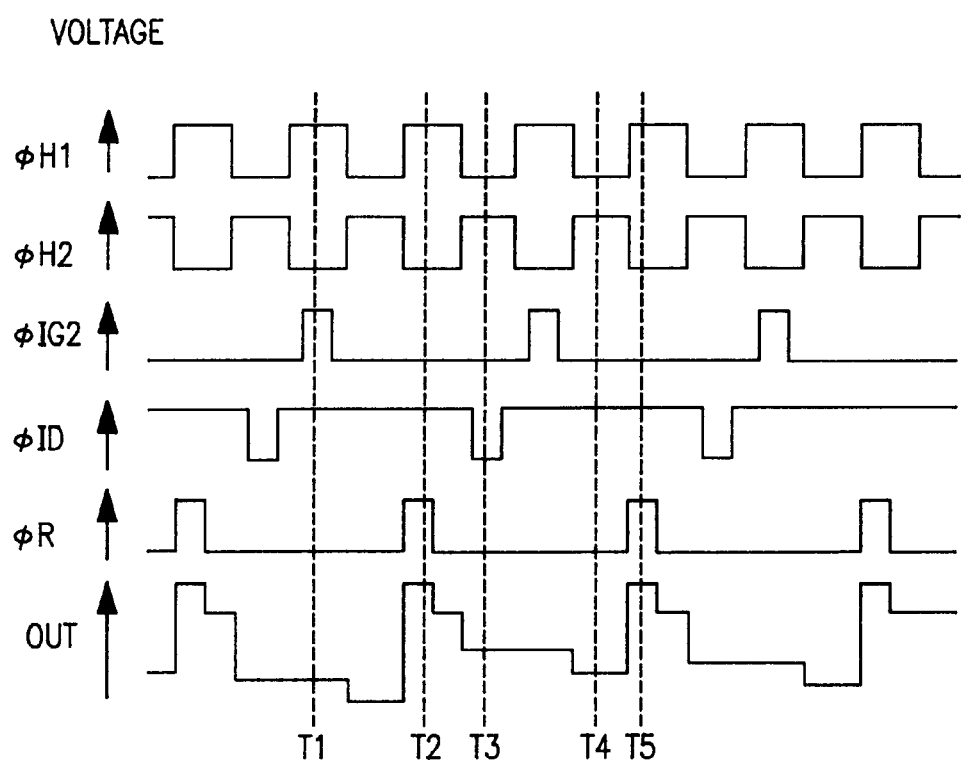
FIG. 10 illustrates pulse voltages to be applied to a charge transfer device in accordance with a variant of the first embodiment.

FIG. 10 illustrates waveforms of pulse voltages to be used for a second method of driving the charge transfer device in accordance with the first embodiment, illustrated in FIGS. 2A and 2B. In this method, a bias charge and a signal charge is alternately transferred.

Similarly to the pulse voltages in FIG. 3, the pulse voltage $\Phi$H1 is applied to the first pairs of transfer electrodes 61 and 62, the pulse voltage $\Phi$H2 is applied to the second pairs of transfer electrodes 71 and 72, the pulse voltage $\Phi$IG2 is applied to the second input gate electrode 17, the pulse voltage $\Phi$ID is applied to the input n$^+$ diffusion region 14, and the pulse voltage $\Phi$R is applied to the reset gate electrode 9. Though not illustrated in FIG. 10, a predetermined voltage is applied to the first input gate electrode 16, the output gate electrode 8, and the reset drain 10. The input n$^+$ floating diffusion region 15 is in a floating condition. A fluctuation in a potential in the n$^+$ floating diffusion region 11 is represented with "OUT".

The second method of driving the charge transfer device is different from the previously mentioned method in that the pulse voltages $\Phi$H1 and $\Phi$H2 are designed to have a frequency twice greater than a frequency of those pulse voltages in the previously mentioned method.

At time T1, a bias charge passing below the second input gate electrode 17 is input into the transfer electrode 61 to which the pulse voltage $\Phi$H1 is applied. At that time, the bias charge input in the previous cycle is transferred to the adjacent transfer electrode 61 beyond the second pair of transfer electrodes 71 and 72.

At time T2, a bias charge is not input to the charge transfer device, because the pulse voltage $\Phi$IG2 is not kept at a high level. Namely, a bias charge is input to every four transfer electrodes 61, 62, 71 and 72 arranged adjacent in a row. Hence, it is possible to alternately transfer a bias charge and a signal charge between the second input gate electrode 17 and the output gate electrode 8 by applying a signal charge to a channel located below a transfer electrode to which a bias charge is not input.

At time T3, the signal charge is transferred into the n$^+$ floating diffusion region 11, and as a result, a fluctuation in a potential corresponding to the transferred signal charge appears in an output waveform. After the fluctuation in a potential has been detected, the bias charge is added to the signal charge at time T4.

At time T5, a high level voltage is applied to the reset gate electrode 9 to thereby reset the n$^+$ floating diffusion region 11. At this time, a charge transfer channel located below the reset gate electrode 9 is set to have a potential lower than a potential in the reset drain 10.

Since the n$^+$ floating diffusion region 11 is reset with the signal and bias charge being added to each other, similarly to the first embodiment, it would be possible to suppress a fluctuation in a reset potential by applying a bias charge greater than a certain value. In accordance with the second method of driving the charge transfer device in accordance with the first embodiment, a signal charge and a bias charge can be independently transferred by means of the charge transfer device. Accordingly, it would be possible to design a charge transfer device to have a width of a charge transfer channel smaller than a channel width of the charge transfer device in accordance with the first embodiment.

[Second Embodiment]

Figure 11:
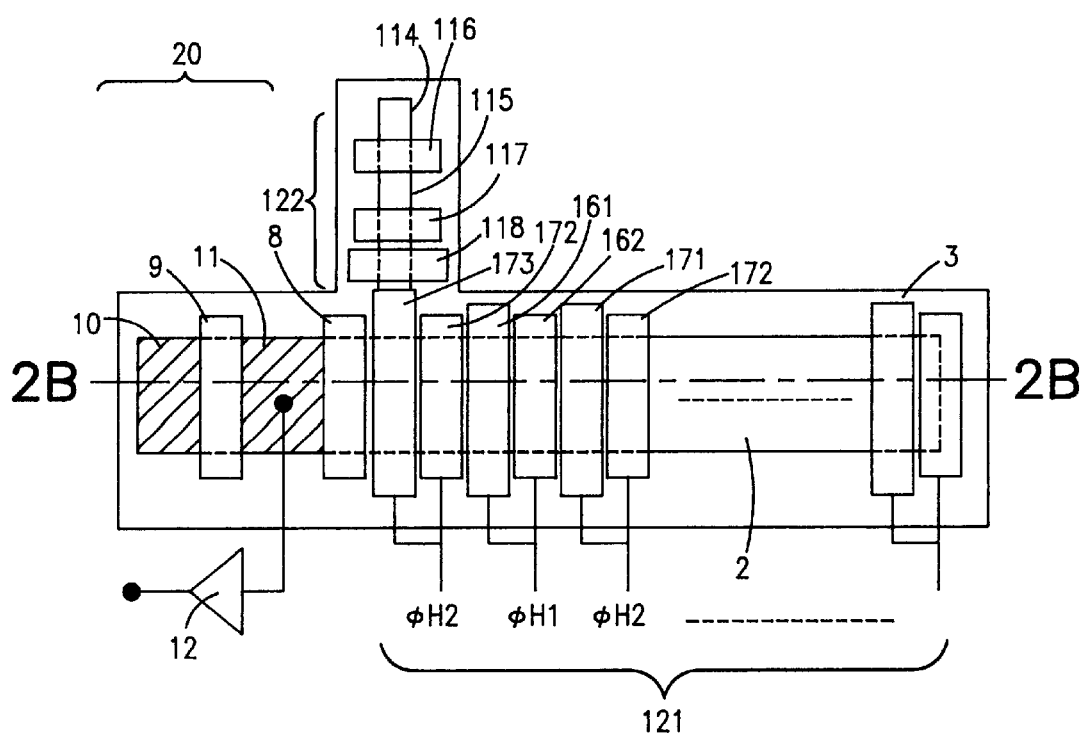
FIG. 11 is a top plan view of a charge transfer device in accordance with the second embodiment of the invention.

FIG. 11 illustrates a charge transfer device in accordance with the second embodiment.

The charge transfer device is comprised of a charge transfer section 121 including first pairs of transfer electrodes 161 and 162, and second pairs of transfer electrodes 171 and 172. The first and second pairs of transfer electrodes are alternately arranged in a row. The illustrated charge transfer device further includes an output gate electrode 8 connected to a final stage of the charge transfer section 121, an n$^+$ floating diffusion region 11, an amplifier 12 for amplifying a voltage in the n$^+$ floating diffusion region 11, a reset gate electrode 9 for resetting the n$^+$ floating diffusion region 11, and a reset drain 10 constituted of an n$^+$ diffusion region. The reset gate electrode 9, the reset drain 10, and the n$^+$ floating diffusion region 11 cooperate with one another to form a field effect transistor 20.

Similarly to the first embodiment, the charge transfer device is comprised of a bias charge input section 122 through which a bias charge is to the charge transfer device. The bias charge input section 122 is comprised of an input n$^+$ diffusion region 114, a first input gate electrode 116, an input n$^+$ floating diffusion region 115, a second input gate electrode 117, and a third input gate electrode 118. The input n$^+$ diffusion region 114 and the input n$^+$ floating diffusion region 115 are both formed in the n-type well 2 and the p-type silicon substrate 1. The first input gate electrode 116 is formed on the silicon dioxide film 5 above the n-type well 2 sandwiched between the input n$^+$ diffusion region 114 and the input n$^+$ floating diffusion region 115, the second input gate electrode 117 is formed on the silicon dioxide film 5 above the n-type well 2 located adjacent to the input n$^+$ floating diffusion region 115, and the third input gate electrode 118 is formed on the silicon dioxide film 5 and adjacent to the second input gate electrode 117. A p$^+$ channel stopper 3 is also formed around the active region where charges are transferred.

The second embodiment is different from the first embodiment in that the bias charge input section 122 is connected to the charge transfer channel in the vicinity of the output gate electrode 8. Though a signal charge input section is not illustrated, signal charges are input into the charge transfer channel from a signal charge input section at a location closer to an input end (a right end in FIG. 11) of the charge transfer device than the bias charge input section 122.

The n-type well 2 in which the charge transfer channels are formed bifurcates upwardly at a transfer electrode 173 to which the pulse voltage ΦH2 is applied. The bias charge input section 122 is formed at a bifurcation of the n-type well 2.

The charge transfer device in accordance with the second embodiment has almost the same cross-section along the line 2B-2B as the cross-section of the first embodiment as illustrated in FIG. 2B, except that the bias charge input section 122 is positioned differently from the bias charge input section 19 of the first embodiment.

Referring back to FIG. 2B, the first and second pairs of transfer electrodes 161, 162, 171 and 172 are formed on the n-type well region 2 formed in the p-type silicon substrate 1 with the silicon dioxide film 5 being sandwiched between the transfer electrodes 161, 162, 171 and 172 and the n-type well region 2. A charge transfer channel is formed in the n-type well 2. The n-type region 4 is formed below every two of the transfer electrodes to thereby generate a difference in a channel voltage. In the second embodiment, the n-type regions 4 are formed below the transfer electrodes 162 and 172.

A pulse voltage ΦH1 is applied to the first pairs of transfer electrodes 161 and 162, and a pulse voltage ΦH2 is applied to the second pairs of transfer electrodes 171 and 172. The pulse voltages ΦH1 and ΦH2 are alternately applied. That is, signal charges are transferred in two-phase drive.

The transfer electrode 173 to which the bias charge is input is designed to have a size greater than the other transfer electrodes 161 and 171 by a degree associated with the amount of a bias charge applied thereto. As an alternative, the transfer electrode 173 may be designed to have the same size as the other transfer electrodes 161 and 171 which are enough to transfer the sum of the signal and bias charges.

Hereinbelow is explained how the charge transfer device in accordance with the second embodiment is driven, with reference to FIGS. 12 and 13.

Figure 12:
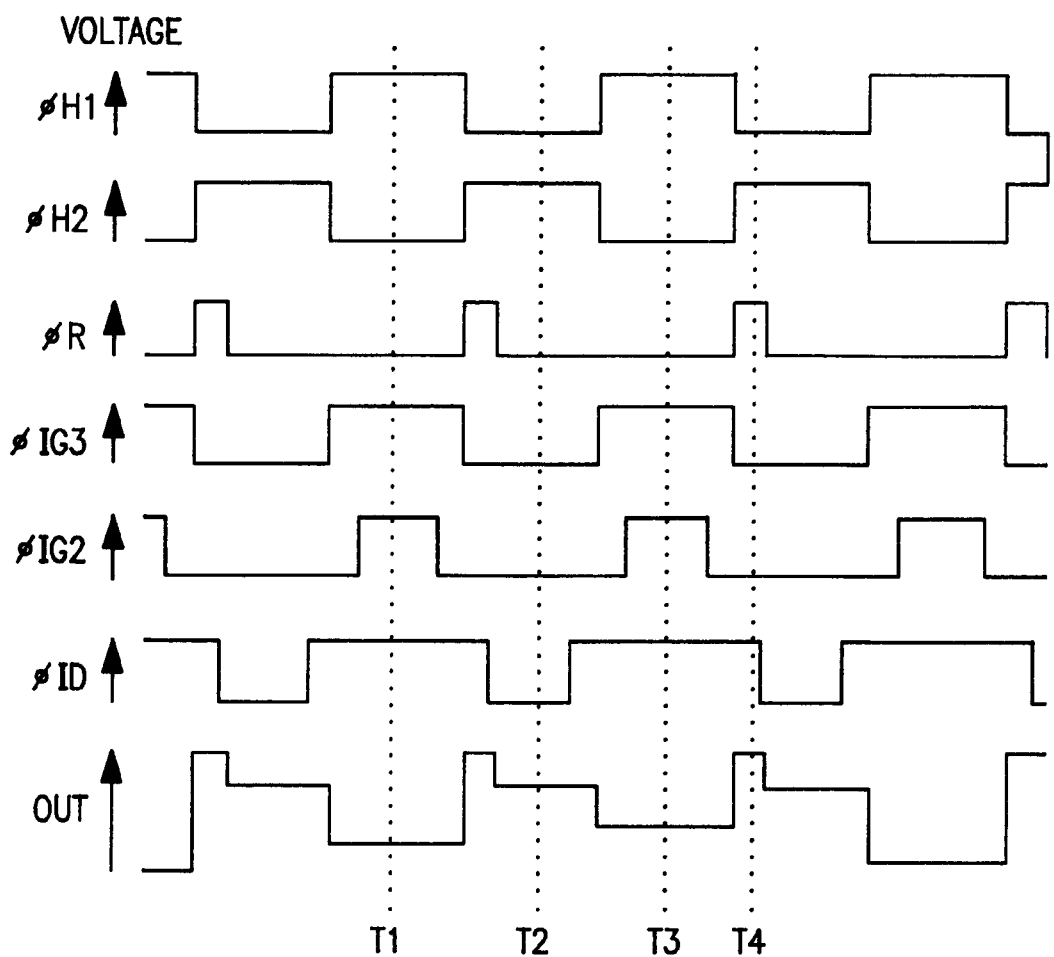
FIG. 12 illustrates pulse voltages to be applied to a charge transfer device in accordance with the second embodiment.
Figure 13:
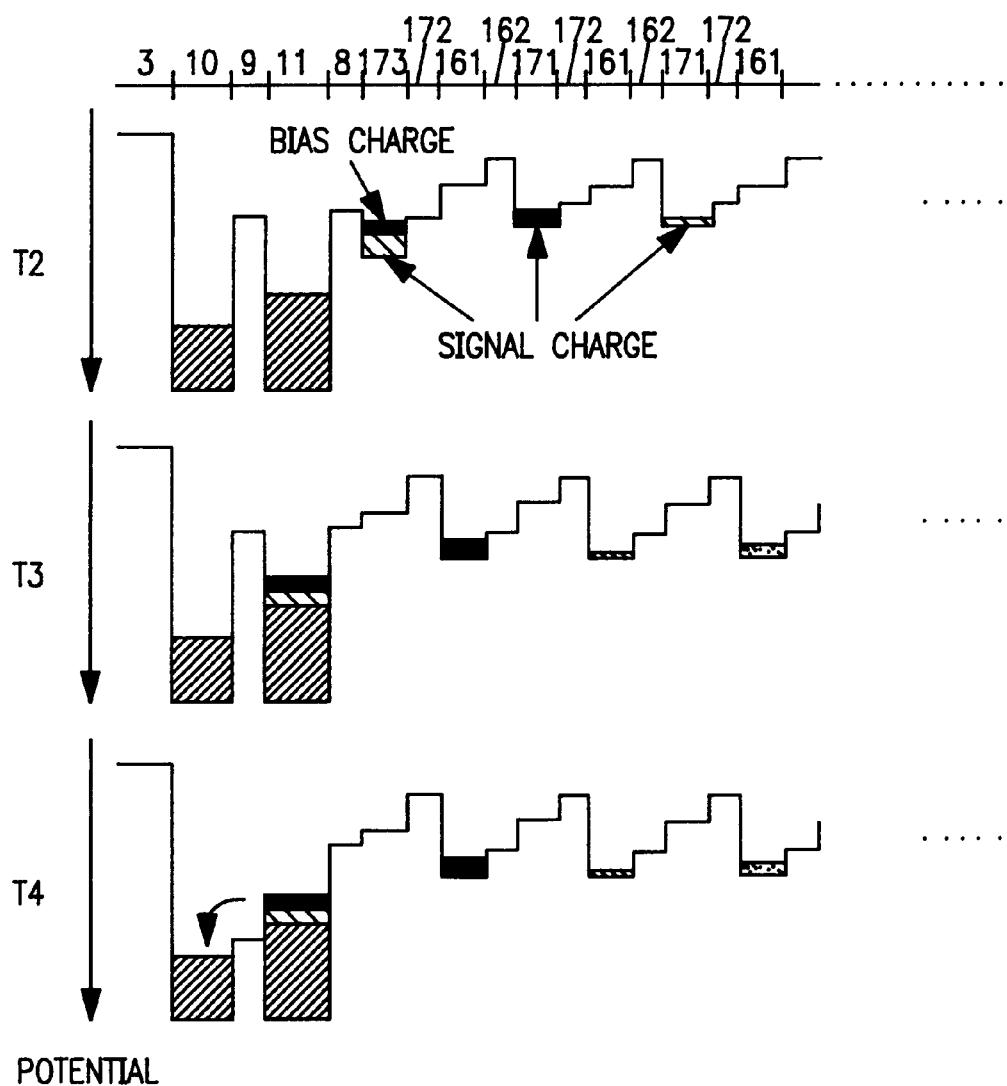
FIG. 13 illustrates a channel potential in the vicinity of a floating diffusion region in a charge transfer device in accordance with the second embodiment.

FIG. 12 illustrates pulse voltages used for driving the charge transfer device in accordance with the above-mentioned second embodiment. The pulse voltage ΦH1 is applied to the first pairs of transfer electrodes 161 and 162, the pulse voltage ΦH2 is applied to the second pairs of transfer electrodes 171, 172 and 173, a pulse voltage ΦR is applied to the reset gate electrode 9, a pulse voltage ΦIG2 is applied to the second input gate electrode 117, a pulse voltage ΦIG3 is applied to the third input gate electrode 118, and a pulse voltage. ΦID is applied to the input n$^+$ diffusion region 114. Though not illustrated in FIG. 12, a predetermined voltage is applied to the first input gate electrode 116, the output gate electrode 8, and the reset drain 10. The input n$^+$ floating diffusion region 115 is in a floating condition. A fluctuation in a potential in the n$^+$ floating diffusion region 11 is represented with "OUT".

A process for inputting a bias charge into the third input gate electrode 118 from the input n$^+$ floating diffusion region 115 is the same as the process in the first embodiment having been explained with reference to FIGS. 3 and 4, if a transfer electrode to which the pulse voltage ΦH1 is applied is replaced with the third input gate electrode 118.

Hereinbelow is explained a process of resetting the n$^+$ floating diffusion region 11, with reference to FIG. 13 which illustrates potentials in the charge transfer channels along the line 2B-2B in FIG. 11 at times T2, T3 and T4 shown in FIG. 12. Numerals shown above the figures of FIG. 13 represent reference numerals indicating the elements of the charge transfer device illustrated in FIG. 11.

At time T1, the pulse voltages ΦIG3 and IG2 are kept at a high level, and hence, a bias charge is transferred through a region located below the second input gate electrode 117 and is input into a region located below the third input gate electrode 118.

At time T2, a signal charge staying below the transfer electrode 161 to which the pulse voltage ΦH1 is applied is transferred to a region located below the transfer electrode 173 to which the pulse voltage ΦH2 is applied, and simultaneously, a bias charge is transferred to the transfer electrode 173 from the third input gate electrode 181. Then, the signal and bias charges are added to each other at a region located below the transfer electrode 173.

At time T3, the thus added signal and bias charges are transferred to the n$^+$ floating diffusion region 11, and amplified in the amplifier 12. The thus amplified charges are output as a signal from the amplifier 12.

At time T4, the pulse voltage ΦR is kept at a high level, and thus the n$^+$ floating diffusion region 11 is reset. At this time, a charge transfer channel located below the reset gate electrode 9 is set to have a potential lower than a potential in the reset drain 10.

As an output signal, there is obtained a signal including an addition brought by the bias charge. It would be easy to subtract the addition from the output signal. If an output signal is in the form of a video signal, it is generally done to offset an output signal, and hence, no problem is caused, even if an addition associated with the bias charge is added to the signal charge.

In the above-mentioned first embodiment, since a maximum amount of charges to be transferred by the charge transfer device has to be greater than a sum of an total amount of signal and bias charges, a charge transfer channel and a transfer electrode cannot avoid to be formed in a large size. In accordance with the above-mentioned second method, a frequency for driving the charge transfer device has to be doubled. Hence, a power consumption would be increased in both of them. To the contrary, the second embodiment provides an advantage that it is possible to avoid increasing a power consumption.

[Third Embodiment]

Figure 14:
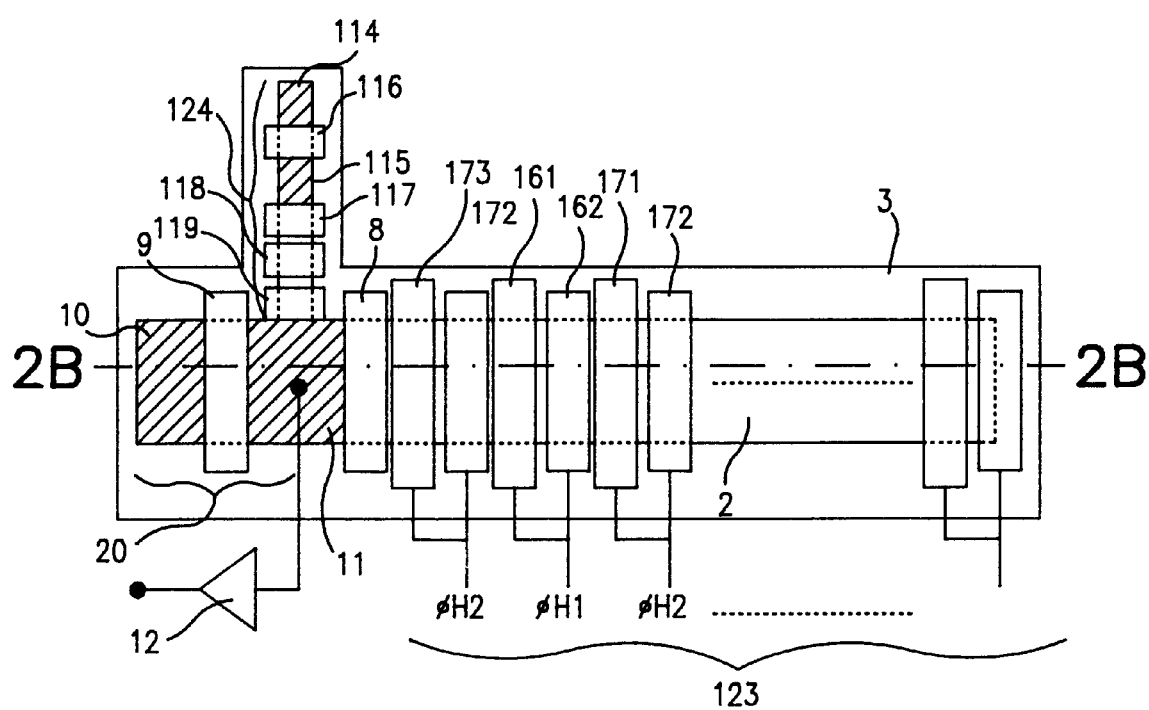
FIG. 14 is a top plan view of a charge transfer device in accordance with the third embodiment of the invention.

FIG. 14 illustrates a charge transfer device in accordance with the third. embodiment.

The charge transfer device is comprised of a charge transfer section 123 including first pairs of transfer electrodes 161 and 162, and second pairs of transfer electrodes 171, 173 and 172. The first and second pairs of transfer electrodes are alternately arranged in a row. The illustrated charge transfer device further includes an output gate electrode 8 connected to a final stage of thus charge transfer section 123, an n$^+$ floating diffusion region 11, an amplifier 12 for amplifying a voltage in the n$^+$ floating diffusion region 11, a reset gate electrode 9 for resetting the n$^+$ floating diffusion region 11, and a reset drain 10 constituted of an n$^+$ diffusion region. The reset gate electrode 9, the reset drain 10, and the n$^+$ floating diffusion region 11 cooperate with one another to form a field effect transistor transistor 20.

Similarly to the first embodiment, the charge transfer device is comprised of a bias charge input section 124 through which a bias charge is to the charge transfer device. The bias charge input section 124 is comprised of an input n$^+$ diffusion region 114, a first input gate electrode 116, an input n$^+$ floating diffusion region 115, a second input gate electrode 117, a third input gate electrode 118, and a fourth input gate electrode 119. The input n$^+$ diffusion region 114 and the input n$^+$ floating diffusion region 115 are both formed in the n-type well 2 and the p-type silicon substrate 1. The first input gate electrode 116 is formed on the silicon dioxide film 5 above the n-type well 2 sandwiched between the input n$^+$ diffusion region 114 and the input n$^+$ floating diffusion region 115, the second input gate electrode 117 is formed on the silicon dioxide film 5 above the n-type well 2 located adjacent to the input n$^+$ floating diffusion region 115, the third input gate electrode 118 is formed on the silicon dioxide film 5 and adjacent to the second input gate electrode 117, and the fourth input gate electrode 119 is formed on the silicon dioxide film 5 and adjacent to the third input gate electrode 118. A p$^+$ channel stopper 3 is also formed around the active region where charges are transferred.

The third embodiment is different from the first embodiment in that the bias charge input section 124 is connected to the n$^+$ floating diffusion region 11. Though a signal charge input section is not illustrated, signal charges are input into the charge transfer channel from a signal charge input section at a location closer to an input end (a right end in FIG. 14) of the charge transfer device than the output gate electrode 8.

The n-type well 2 in which the charge transfer channels are formed bifurcates upwardly at the n$^+$ floating diffusion region 11. The bias charge input section 124 is formed at a bifurcation of the n-type well 2.

The charge transfer device in accordance with the third embodiment has almost the same cross-section along the line 2B-2B as the cross-section of the first embodiment as illustrated in FIG. 2B, except that the bias charge input section 124 is positioned differently from the bias charge input section 19 of the first embodiment.

When a bias charge is input to the charge transfer device in accordance with the third embodiment, a predetermined voltage is applied to the output gate electrode 8, the first input gate electrode 116 and the fourth input gate electrode 119, and the pulse voltages ΦIG2, ΦIG3 and ΦID are applied with a delay by half a cycle. The pulse voltages used in the third embodiment have the same waveforms as those illustrated in FIG. 12, but are applied with a delay by a half a cycle.

At time T3, the pulse voltage ΦIG3 is kept at a low level and a bias charge is transferred to the n$^+$ floating diffusion region 11 from a region located below the third input gate electrode 118 through a region located below the fourth input gate electrode 119. The thus transferred bias charge is added to a signal charge transferred to the n$^+$ floating diffusion region 11 from the charge transfer channel.

At time T4, the pulse voltage ΦR is kept at a high level and thus the n$^+$ floating diffusion region 11 is reset. At this time, a charge transfer channel located below the reset gate electrode 9 is set to have a potential lower than a potential in the reset drain 10.

In the third embodiment, it would be possible to input a bias charge into the n$^+$ floating diffusion region 11 after a signal charge has been detected, by retarding a time at which the pulse voltage ΦIG3 is turned to a low level to thereby shorten a period of time in which the pulse voltage ΦIG3 is at a low level.

[Fourth Embodiment]

Figure 15:
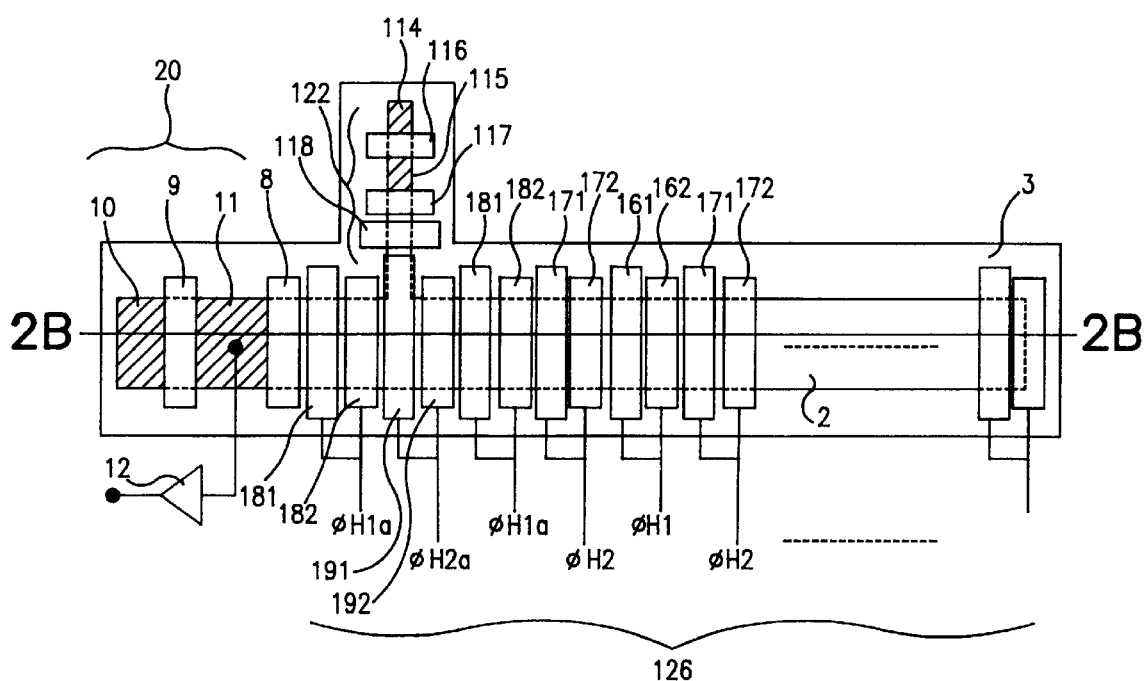
FIG. 15 is a top plan view of a charge transfer device in accordance with the fourth embodiment of the invention.

FIG. 15 illustrates a charge transfer device in accordance with the fourth embodiment.

The charge transfer device is comprised of a charge transfer section 126 including first pairs of transfer electrodes 161 and 162, second pairs of transfer electrodes 171 and 172, third pairs of transfer electrodes 181 and 182, and fourth pairs of transfer electrodes 191 and 192. The first and second pairs of transfer electrodes are alternately arranged in a row. Similarly, the third and fourth pairs of transfer electrodes are alternately arranged in a row. As a whole, a group of the first and second pairs of transfer electrodes and a group of the third and fourth electrodes are arranged in a row.

The illustrated charge transfer device further includes an output gate electrode 8 connected to a final stage of the charge transfer section 126, an n$^+$ floating diffusion region 11, an amplifier 12 for amplifying a voltage in the n$^+$ floating diffusion region 11, a reset gate electrode 9 for resetting the n$^+$ floating diffusion region 11, and a reset drain 10 constituted of an n$^+$ diffusion region. The reset gate electrode 9, the reset drain 10, and the n$^+$ floating diffusion region 11 cooperate with one another to form a field effect transistor 20.

Similarly to the first embodiment, the charge transfer device is comprised of a bias charge input section 122 through which a bias charge is to the charge transfer device. The bias charge input section 122 is comprised of an input n$^+$ diffusion region 114, a first input gate electrode 116, an input n$^{30}$ floating diffusion region 115, a second input gate electrode 117, and a third input gate electrode 118. The input n$^+$ diffusion region 114 and the input n$^+$ floating diffusion region 115 are both formed in the n-type well 2 and the p-type silicon substrate 1. The first input gate electrode 116 is formed on the silicon dioxide film 5 above the n-type well 2 sandwiched between the input n$^+$ diffusion region 114 and the input n$^+$ floating diffusion region 115, the second input gate electrode 117 is formed on the silicon dioxide film 5 above the n-type well 2 located adjacent to the input n$^+$ floating diffusion region 115, and the third input gate electrode 118 is formed on the silicon dioxide film 5 and adjacent to the second input gate electrode 117. A p$^+$ channel stopper 3 is also formed around the active region where charges are transferred.

In the fourth embodiment, the bias charge input section 122 is connected to the transfer electrode 191. Though a signal charge input section is not illustrated, signal charges are input into the charge transfer channel from a signal charge input section at a location closer to an input end (a right end in FIG. 15) of the charge transfer device than the bias charge input section 122.

The n-type well 2 in which the charge transfer channels are formed bifurcates upwardly at the transfer electrode 191 to which a later mentioned pulse voltage ΦH2$a$ is applied. The bias charge input section 122 is formed at a bifurcation of the n-type well 2. The transfer electrode 191 to which the bias charge input section 122 is connected is designed to be greater in size than the other transfer electrodes.

The charge transfer device in accordance with the fourth embodiment has almost the same cross-section along the line 2B-2B as the cross-section of the first embodiment as illustrated in FIG. 2B, except that the bias charge input section 122 is positioned differently from the bias charge input section 19 of the first embodiment.

With reference again to FIG. 2B, the first to fourth pairs of transfer electrodes 161, 162, 171, 172, 181, 182, 191 and 192 are formed on the n-type well region 2 formed in the p-type silicon substrate 1 with the silicon dioxide film is being sandwiched between those transfer electrodes and the n-type well region 2. A charge transfer channel is formed in the n-type well 2. The n$^-$ type region 4 is formed below every two of the transfer electrodes to thereby generate a difference in a channel voltage. In the fourth embodiment, the n type regions 4 are formed below the transfer electrodes 162, 172, 182 and 192.

A pulse voltage ΦH1 is applied to the first pairs of transfer electrodes 161 and 162, a pulse voltage ΦH2 is applied to the second pairs of transfer electrodes 171 and 172, a pulse voltage ΦH1$a$ is applied to the third pairs of transfer electrodes 181 and 182, and a pulse voltage ΦH2$a$ is applied to the fourth pairs of transfer electrodes 191 and 192.

Hereinbelow is explained how the charge transfer device in accordance with the fourth embodiment is driven, with reference to FIG. 16. The pulse voltage ΦH1 is applied to the first pairs of transfer electrodes 161 and 162, the pulse voltage ΦH2 is applied to the second pairs of transfer electrodes 171 and 172, the pulse voltage ΦH1$a$ is applied to the third pairs of transfer electrodes 181 and 182, the pulse voltage ΦH2$a$ is applied to the fourth pairs of transfer electrodes 191 and 192, a pulse voltage ΦR is applied to the reset gate electrode 9, a pulse voltage ΦIG2 is applied to the second input gate electrode 117, a pulse voltage ΦIG3 is applied to the third input gate electrode 118, and a pulse voltage Φ1D is applied to the input n$^+$ diffusion region 114. Though not illustrated in FIG. 16, a predetermined voltage is applied to the first input gate electrode 116, the output gate electrode 8, and the reset drain 10. The input n$^+$ floating diffusion region 115 is in a floating condition. A fluctuation in a potential in the n$^+$ floating diffusion region 11 is represented with "OUT".

Figure 16:
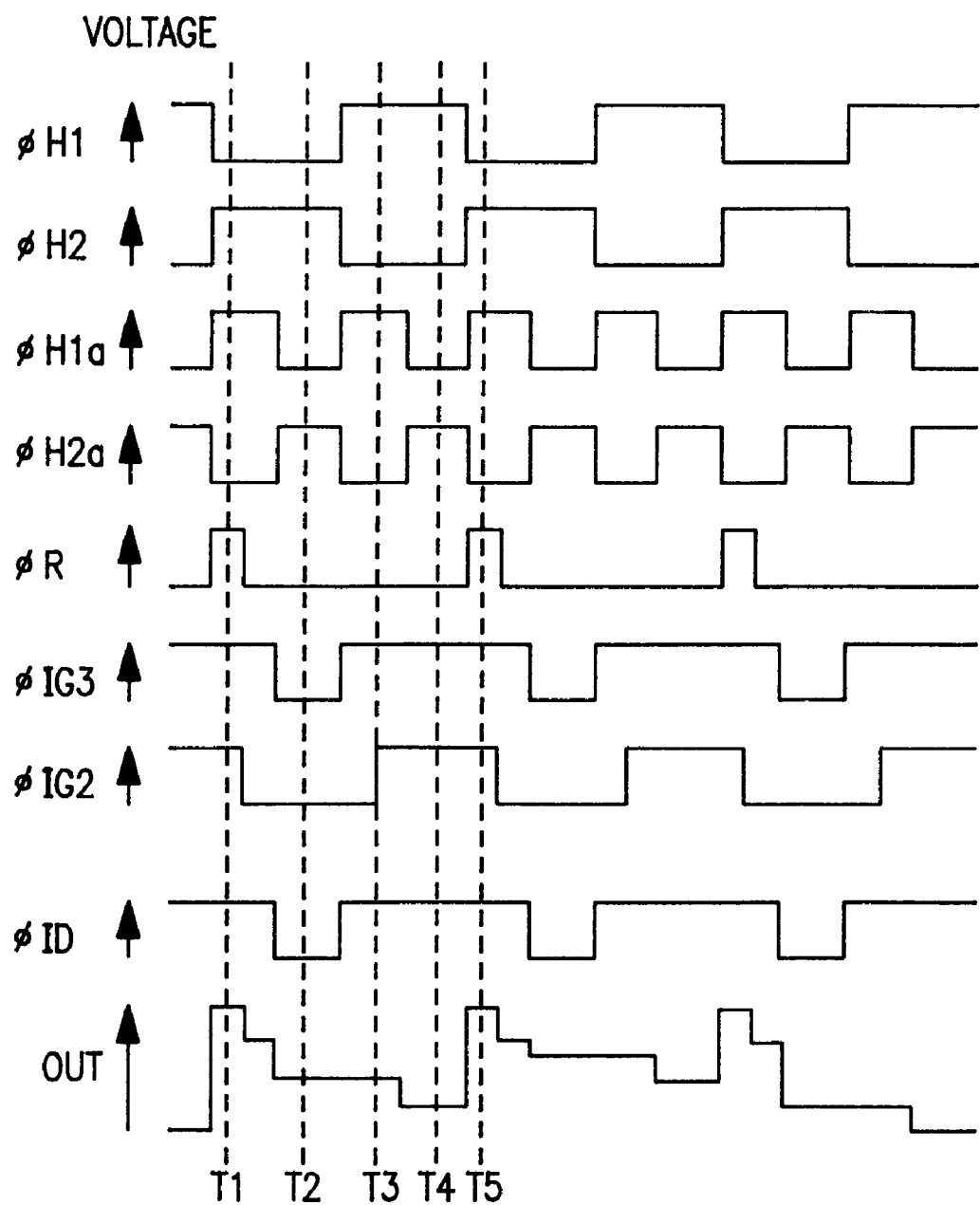
FIG. 16 illustrates pulse voltages to be applied to a charge transfer device in accordance with the fourth embodiment.

As is obvious in FIG. 16, the pulse voltages ΦH1$a$ and ΦH2$a$ are designed to have a frequency twice greater than a frequency of the pulse voltages ΦH1 and ΦH2.

A process for inputting a bias charge into the third input gate electrode 118 from the input n$^+$ floating diffusion region 115 is the same as the process in the first embodiment having been explained with reference to FIGS. 3 and 4, if the transfer electrode 61 to which the pulse voltage ΦH1 is applied is replaced with the third input gate electrode 118.

Figure 17:
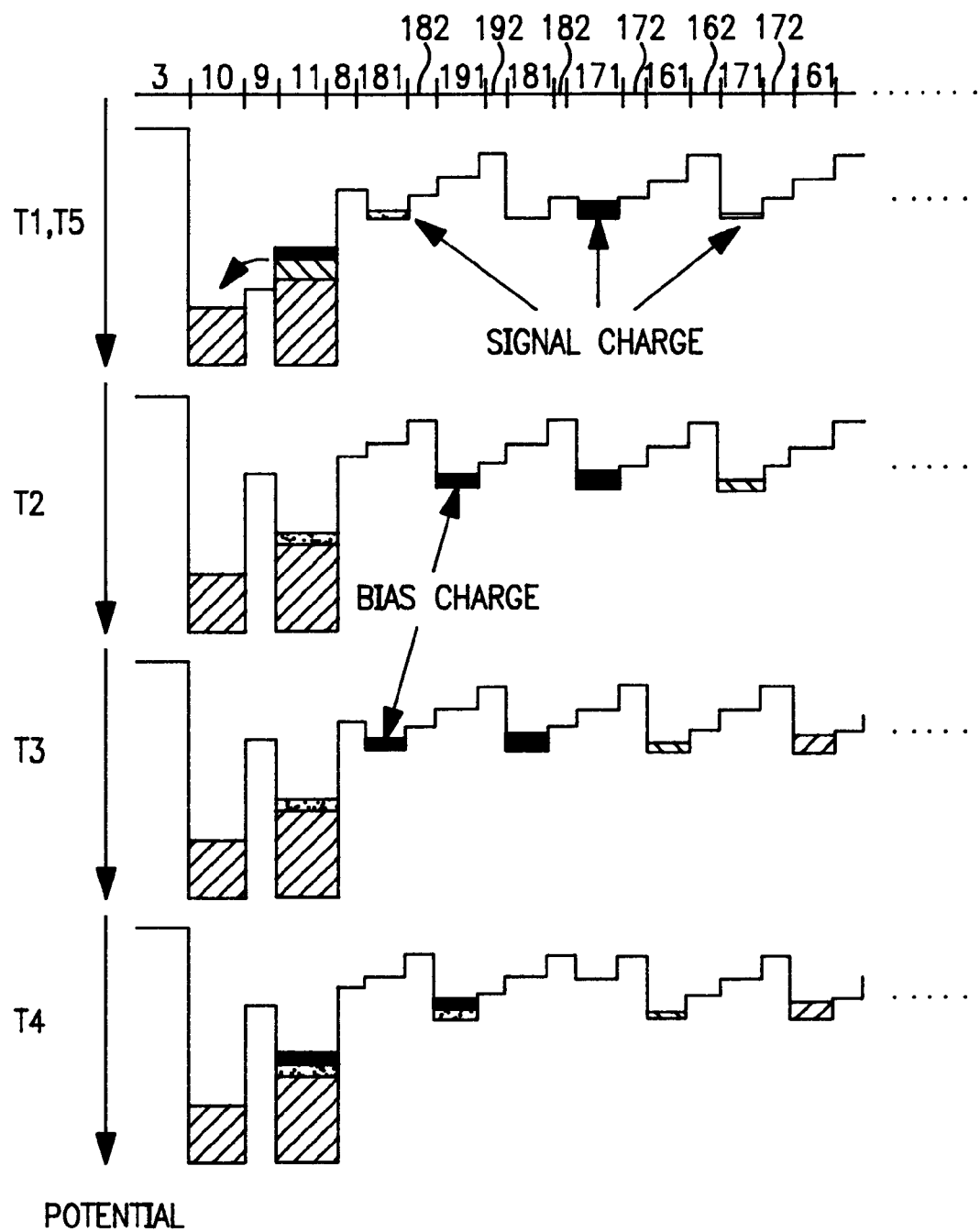
FIG. 17 illustrates a channel potential in the vicinity of a floating diffusion region in a charge transfer device in accordance with the fourth embodiment.

Hereinbelow is explained a process of resetting the n$^+$ floating diffusion region 11, with reference to FIG. 17 which illustrates potentials in the charge transfer channels along the line 2B-2B in FIG. 15 at times T1, T2, T3, T4 and T5 shown in FIG. 16. Numerals shown above the figures of FIG. 17 represent reference numerals indicating the elements of the charge transfer device illustrated in FIG. 15.

At time T1, the pulse voltages ΦIG3 and ΦIG2 are kept at a high level, and hence, a bias charge is transferred through a region located below the second input gate electrode 117 and is input into a region located below the third input gate electrode 118. Since the pulse voltages ΦH2 and ΦH1$a$ are both kept at a high level, the signal charge stay in a region located below the transfer electrode 171 to which the pulse voltage ΦH2 is applied. The signal charge transferred in the previous cycle stays in a region located below the transfer electrode 181 which is adjacent to the output gate electrode 8 and to which the pulse voltage ΦH1$a$ is applied.

At time T2, a signal charge is transferred to a region located below the transfer electrode 191 from a region located below the third input gate electrode 118, and simultaneously, a signal charge of the previous cycle is transferred to the n$^+$ floating diffusion region 11. Thus, a potential fluctuation in the n$^+$ floating diffusion region 11, caused by the signal charge, is detected.

At time T3, a bias charge is transferred to a region located below the transfer electrode 181 which is adjacent to the output gate electrode 8 and to which the pulse voltage ΦH1$a$ is applied, and a signal charge is transferred from the transfer electrode to which the pulse voltage ΦH2 is applied, to a region located below the transfer electrode 181 which is adjacent to the transfer electrode 171 and to which the pulse voltage ΦH1$a$ is applied.

At time T4, the bias charge is transferred to the n$^+$ floating diffusion region 11, and is added to the signal charge.

At time T5, the pulse voltage ΦR is kept at a high level, and is applied to the reset gate electrode 9. As a result, the n$^+$ floating diffusion region 11 is reset. At this time, a charge transfer channel located below the reset gate electrode 9 is set to have a potential lower than a potential in the reset drain 10.

In accordance with the fourth embodiment, it is possible to detect only signal charges by detecting "OUT" at time T3.

[Fifth Embodiment]

Figure 18A:
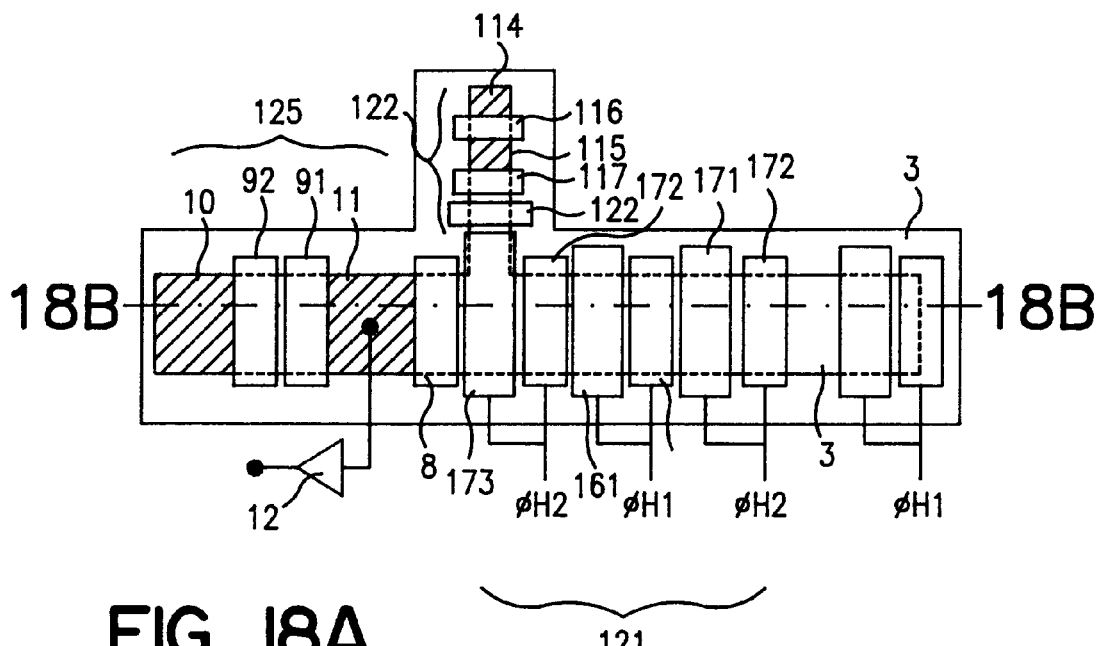
FIG. 18A illustrates a pulse voltage to be applied to a charge transfer device in accordance with the fifth embodiment.
Figure 18B:
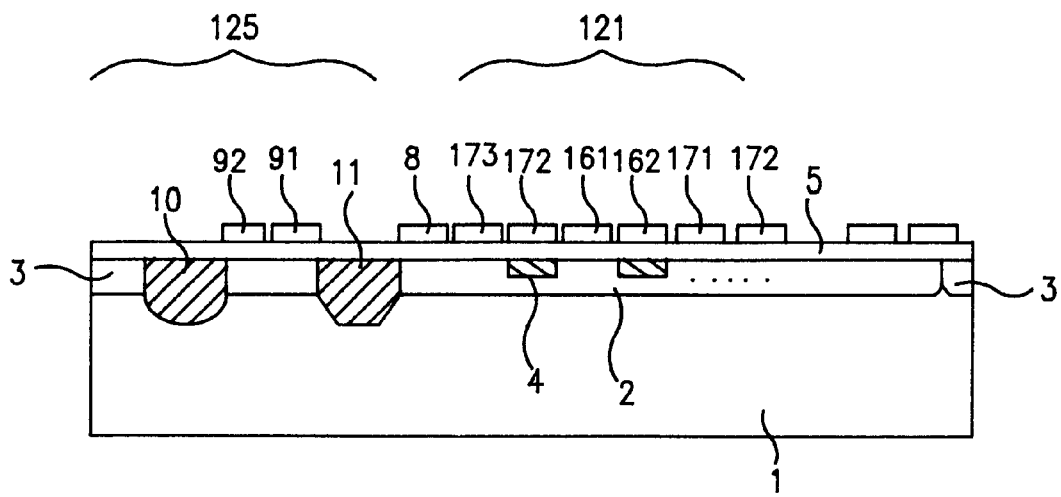
FIG. 18B is a cross-sectional view taken along the line 18B-18B in FIG. 18A.

FIGS. 18A and 18B illustrate a charge transfer device in accordance with the fifth embodiment.

The charge transfer device is comprised of a charge transfer section 121 including first pairs of transfer electrodes 161 and 162, and second pairs of transfer electrodes 171, 172 and 173. The first and second pairs of transfer electrodes are alternately arranged in a row. The charge transfer device further includes an output gate electrode 8 connected to a final stage of the charge transfer section 121, an n$^+$ floating diffusion region 11, an amplifier 12 for sampling a voltage in the n$^+$ floating diffusion region 11, a first reset gate electrode 91, a second reset gate electrode 92, and a reset drain 10 constituted of an n$^+$ diffusion region. The reset gate electrodes 91, 92, the reset drain 10, and the n$^+$ floating diffusion region 11 cooperate with one another to form a field effect transistor 125.

The first and second reset gate electrodes 91 and 92 are arranged adjacent to each other. The first and second reset gate electrodes 91 and 92 cooperate with each other to thereby reset the n$^+$ floating diffusion region 11.

The charge transfer device further includes a bias charge input section 122 through which a bias charge is to the charge transfer device. The bias charge input section 122 is comprised of an input n$^+$ diffusion region 114, a first input gate electrode 116, an input n$^+$ floating diffusion region 115, a second input gate electrode 117, and a third input gate electrode 118. The input n$^+$ diffusion region 114 and the input n$^+$ floating diffusion region 115 are both formed in the n-type well 2 and the p-type silicon substrate 1. The first input gate electrode 116 is formed on the silicon dioxide film 5 above the n-type well 2 sandwiched between the input n$^+$ diffusion region 114 and the input n$^+$ floating diffusion region 115, the second input gate electrode 117 is formed on the silicon dioxide film 5 above the n-type well 2 located adjacent to the input n$^+$ floating diffusion region 115, and the third input gate electrode 118 is formed on the silicon dioxide film 5 and adjacent to the second input gate electrode 117. A p$^+$ channel stop 3 is also formed around the active region where charges are transferred.

Though a signal charge input section is not illustrated, signal charges are input into the charge transfer channel from a signal charge input section at a location closer to an input end (a right end in FIG. 18A) of the charge transfer device than the bias charge input section 122.

The n-type well 2 in which the charge transfer channels are formed bifurcates upwardly at the transfer electrode 173 to which the pulse voltage ΦH2 is applied. The bias charge input section 122 is formed at a bifurcation of the n-type well 2.

With reference to FIG. 18B, the first and second pairs of transfer electrodes 161, 162, 171, 172 and 173 are formed on the n-type well region 2 formed in the p-type silicon substrate 1 with the silicon dioxide film 5 being sandwiched between the transfer electrodes 161, 162, 171, 172 and 173 and the n-type well region 2. A charge transfer channel is formed in the n-type well 2. The n$^-$ type region 4 is formed below every two of the transfer electrodes to thereby generate a difference in a channel voltage. In the fifth embodiment, the n$^-$ type regions 4 are formed below the transfer electrodes 162 and 172.

A pulse voltage ΦH1 is applied to the first pairs of transfer electrodes 161 and 162, and a pulse voltage ΦH2 is applied to the second pairs of transfer electrodes 171, 172 and 173. The pulse voltages ΦH1 and ΦH2 are alternately applied. That is, signal charges are transferred in two-phase drive.

The present embodiment is characterized by the two reset gate electrodes 91 and 92 for resetting the n$^+$ floating diffusion region 11. The first reset gate electrode 91 is located adjacent to the n$^+$ floating diffusion region 11, and the second reset gate electrode 92 is located adjacent to the reset drain 10.

Figure 19:
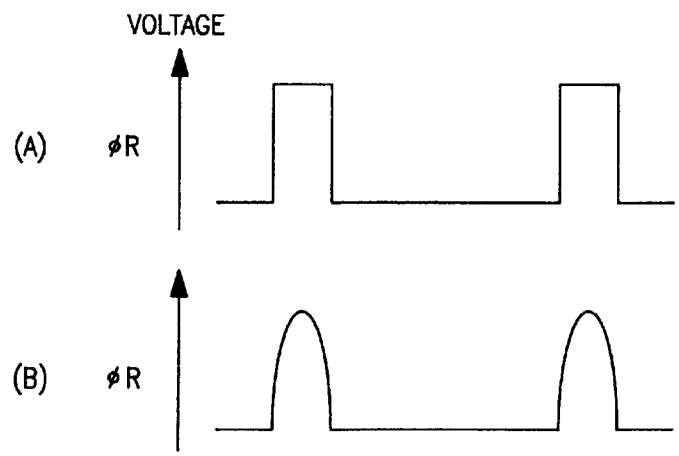
FIG. 19 illustrates a pulse voltage to be applied to a charge transfer device in accordance with the fifth embodiment.

In the above-mentioned embodiments, a pulse voltage ΦR to be applied to the reset gate electrode has a rectangular waveform, as illustrated in FIG. 19-(A). In the present embodiment, a pulse voltage as illustrated in FIG. 19-(B) may be applied to one of the first and second reset gate electrodes 91 and 92. The illustrated pulse voltage does not have a rectangular waveform, but has a waveform having a high level in a short period of time and having no flat high level. Even if the pulse voltage as illustrated in FIG. 19-(B) is applied to one of the first and second reset gate electrodes 91 and 92, it would be possible to reset the n$^+$ floating diffusion region 11 at a desired potential.

For instance, the pulse voltage ΦR may be applied to one of the first and second reset gate electrodes 91 and 92 at the same timing as that of the above-mentioned embodiments, and a constant voltage may be applied to the other. This enables the reset operation to be carried out not on the basis of a potential in a channel located below one of the first and second reset gate electrodes 91 and 92 to which the pulse voltage ΦR is applied at its high level, but on the basis of a potential in a channel located below the other to which a constant voltage is applied. Thus, it is possible to reset the n$^+$ floating diffusion region 11 so that the n$^+$ floating diffusion region 11 has a potential close to the potential in a channel located under the reset gate electrode to which a constant voltage is applied. Accordingly, it is possible to stably obtain a reset potential.

Hereinbelow is explained the above-mentioned process of resetting the n$^+$ floating diffusion region 11, with reference to FIG. 20 which illustrates potentials in the charge transfer channels at various components. Numerals shown above the figures of FIG. 20 represent reference numerals indicating the elements of the charge transfer device illustrated in FIGS. 18A and 18B.

Figure 20:
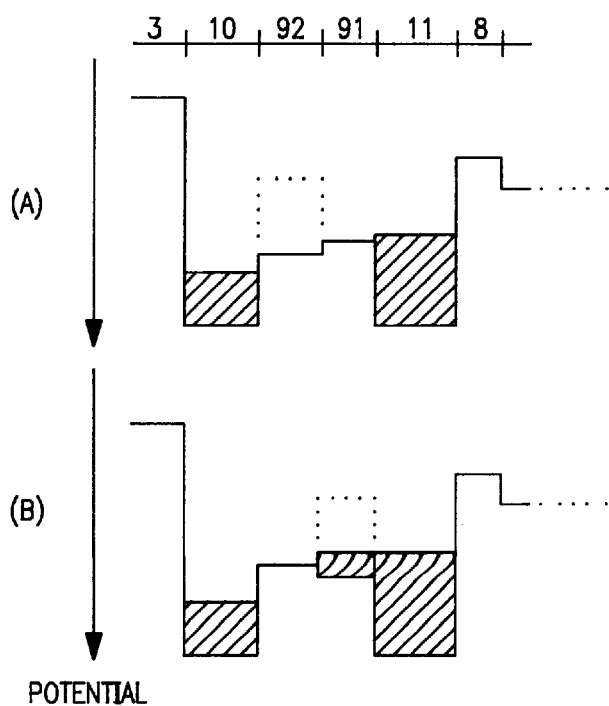
FIG. 20 illustrates a channel potential in the vicinity of a floating diffusion region in a charge transfer device in accordance with the fifth embodiment.

FIG. 20-(A) illustrates a channel potential along the line 18B-18B in FIG. 18A in the case that the pulse voltage ΦR is applied to the second reset gate electrode 92, and a constant voltage is applied to the first reset gate electrode 91. In FIG. 20-(A), a solid line indicates a potential in a channel located below the second reset gate electrode 92, found when the pulse voltage ΦR is at its high level, whereas a dotted line indicates a potential in the channel found when the pulse voltage ΦR is at its low level. The timing at which the pulse voltage ΦR is applied is the same as the timing shown in FIG. 3.

As illustrated in FIG. 19, the pulse voltage ΦR has a high level and a low level. Similarly to the above-mentioned embodiments, it is necessary to design the high level in such a manner that when the pulse voltage ΦR is at a high level, a reset gate electrode is turned on, and hence, the n$^+$ floating diffusion region 11 is reset, and that when the pulse voltage ΦR is at a low level, a reset gate electrode is turned off, and hence, the n$^+$ floating diffusion region 11 is not reset. To this end, a potential in a channel located below the second reset gate electrode 92 is designed to be higher than a potential in a channel located below the first reset gate electrode 91, when the pulse voltage ΦR is at a high level thereof.

In FIG. 20-(A), a potential in a channel located below the second reset gate electrode 92 is set lower than a voltage in the reset drain 10. However, it should be noted that a voltage in the reset drain 10 may be set intermediate between potentials in channels located below the first and second reset gate electrodes 91 and 92.

Hereinbelow is explained how the above-mentioned voltages are set. Since the first and second reset gate electrodes 91 and 92 have the same channel dimension, the same structure of a gate insulating film, and the same impurities profile in the charge transfer device illustrated in FIGS. 18A and 18B, channels located below the first and second reset gate electrodes 91 and 92 have the same potential, if a common voltage is applied to both the first and second reset gate electrodes 91 and 92, regardless of a dispersion in fabrication of the charge transfer device. That is, it is unnecessary to consider a reset margin caused by a dispersion in a process. Hence, what is necessary is to design the pulse voltage ΦR to be applied to the second reset gate electrode 92 to have a high level higher than a voltage to be applied to the first reset gate electrode 91.

As illustrated in FIG. 20, a potential in a channel located below the second reset gate electrode 92 is lower than a potential at which the n⁺ floating diffusion region 11 is reset, when the pulse voltage ΦR is at a low level thereof. A period of time during which the n⁺ floating diffusion region 11 is reset is equal to a time during which a potential in a channel located below the second reset gate electrode 92 is higher than a potential in a channel located below the first reset gate electrode 91.

As mentioned above, even if the field effect transistor 125 is provided with two reset gate electrodes, they can properly operate by applying a constant voltage to one of the reset gate electrodes, even if a pulse voltage ΦR which does not have a rectangular wave is applied to the other.

As an alternative to the above-mentioned method of setting the voltage, channels located below the first and second reset gate electrodes 91 and 92 may be designed to have different dimensions so that a potential in a channel located below the second reset gate electrode 92 is higher than a potential in a channel located below the first reset gate electrode 91, when a common voltage is applied to the first and second reset gate electrodes 91 and 92, to thereby equalize a high level in the pulse voltage ΦR to be applied to the second reset gate electrode 92 to a voltage to be applied to the first reset gate electrode 91. For the same purpose, the first and second reset gate electrodes 91 and 92 may be designed to have insulating films having different structures. As an alternative, the first and second reset gate electrodes 91 and 92 may be designed to have channels having different impurity profiles.

As illustrated in FIG. 20-(B), the pulse voltage ΦR may be applied to the first reset gate electrode 91, and a constant voltage may be applied to the second reset gate electrode 92, to the contrary of the above-mentioned method. Voltages to be applied to the first and second reset gate electrodes 91 and 92 are just opposite to the voltages in the above description. The same advantages as those of the above-mentioned method can be obtained.

[Sixth Embodiment]

Figure 21A:
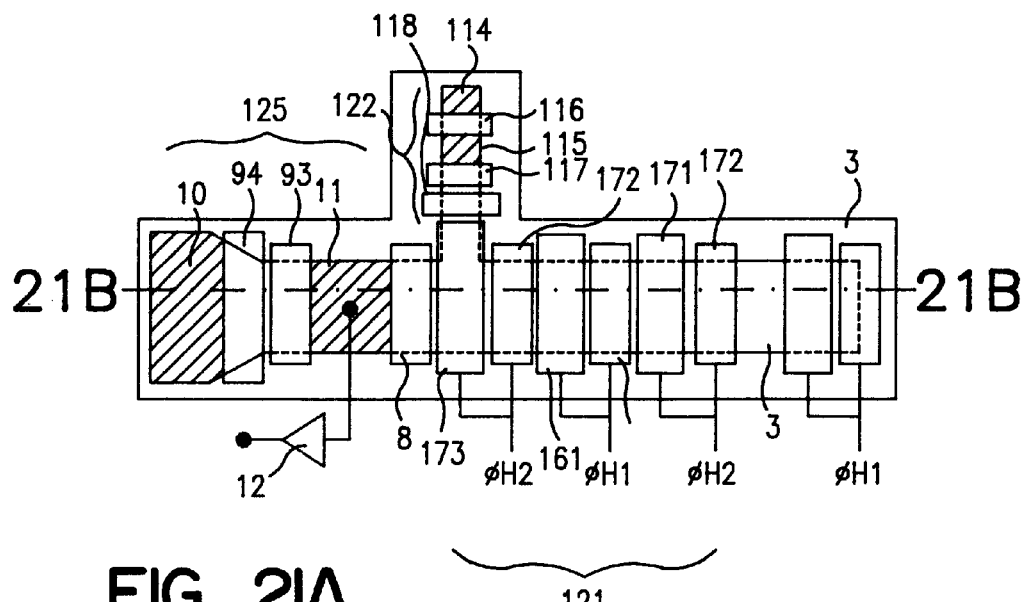
FIG. 21A illustrates a pulse voltage to be applied to a charge transfer device in accordance with the sixth embodiment.
Figure 21B:
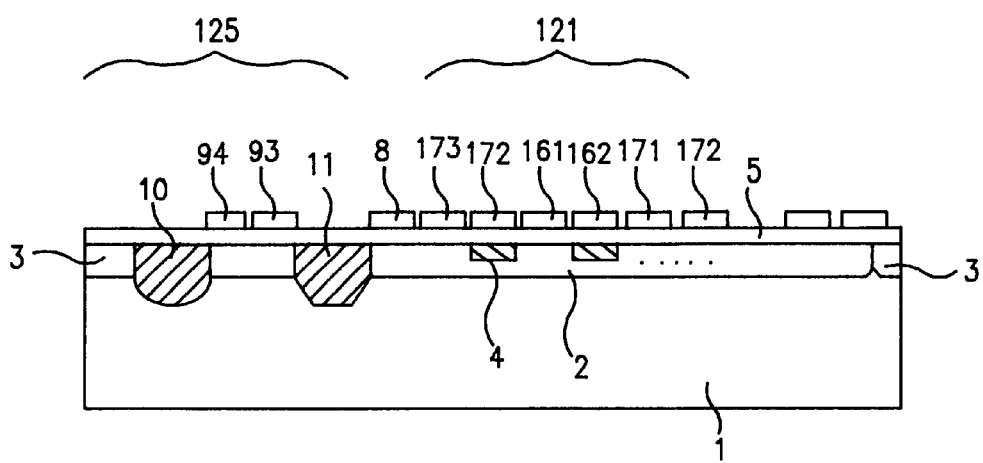
FIG. 21B is a cross-sectional view taken along the line 21B-21B in FIG. 21A.

FIGS. 21A and 21B illustrate a charge transfer device in accordance with the sixth embodiment.

The illustrated charge transfer device has almost the same structure as the structure of the charge transfer device in accordance with the above-mentioned fifth embodiment, but is different in that a second reset gate electrode 94 is designed to be larger in size than a first reset gate electrode 93, and that the channel located below the second reset gate electrode 94 is designed to have a width increasing towards the reset drain 10. The charge transfer device in accordance with the present embodiment is driven in the same manner as that of the charge transfer device in accordance with the fifth embodiment.

Figure 22A:
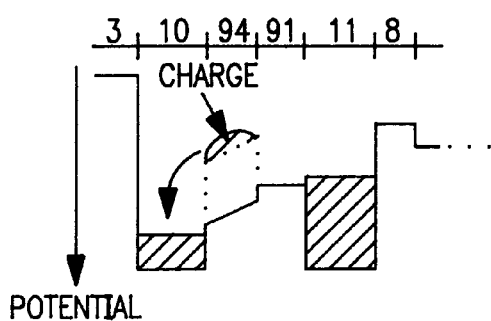
FIGS. 22A to 22D illustrate a channel potential in the vicinity of a floating diffusion region in a charge transfer device.

A channel having a smaller width has a lower potential due to the narrow channel effect, if an impurity profile in a channel is common. FIG. 22A illustrates a potential in a channel along the line 21B-21B in FIG. 21A, generated when the pulse voltage ΦR is applied to the second reset gate electrode 94, and a constant voltage is applied to the first reset gate electrode 93. In FIG. 22A, a solid line indicates a potential in a channel located below the second reset gate electrode 94, generated when the pulse voltage ΦR is at a high level thereof, and a dotted line indicates the same generated when the pulse voltage ΦR is at a low level thereof.

Since a potential in a channel located below the second reset gate electrode 94 is increasing towards the reset drain 10, charges existing below the second reset gate electrode 94 are all swept into the reset drain 10 while the pulse voltage ΦR varies from a high level to a low level thereof. Thus, it is possible to suppress partition noises caused by fluctuation in an amount of charges entering the n⁺ floating diffusion region 11 from a channel located beneath the reset gate while the pulse voltage ΦR varies from a high level to a low level.

In FIG. 22A, when a high level potential is applied to the second reset gate electrode 94, a minimum potential in a channel located below the second reset gate electrode 94 may be set higher than a potential in a channel located below the first reset gate electrode 93.

Figure 22C:
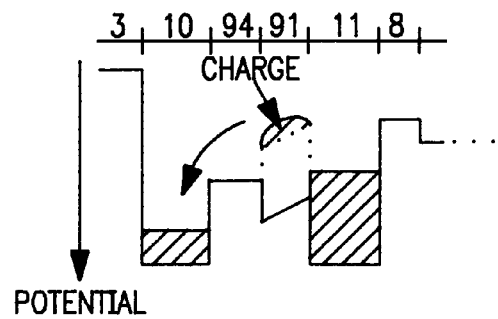
Figure 22B:
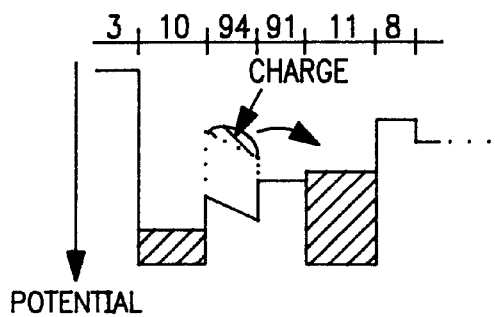

In the charge transfer device illustrated in FIG. 21A, a channel located below the second reset gate electrode 94 is designed to have a width increasing towards the reset drain 10. As an alternative, a channel located below the second reset gate electrode 94 may be designed to have a width decreasing towards the reset drain 10 so that a potential in a channel becomes higher towards the first reset gate electrode 93, in which case, charges existing below the second reset gate electrode 94 are all returned back to the n⁺ floating diffusion region 11 while the pulse voltage ΦR varies from a high level to a low level thereof. When the pulse voltage ΦR is at a high level thereof, a potential is set in such a manner as a solid line in illustrated in FIG. 22B, whereas when the pulse voltage ΦR is at a low level thereof, a potential is set in such a manner as a broken line in illustrated in FIG. 22B. Thus, it is also possible to suppress partition noises caused by fluctuation in an amount of charges entering the n⁺ floating diffusion region 11 from a channel located beneath the reset gate while the pulse voltage ΦR varies from a high level to a low level.

Figure 22D:
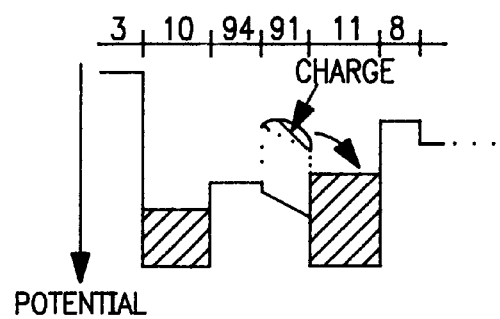

Those skilled in the art could readily understand that the above-mentioned partition noises could be suppressed, if a channel configuration and a voltage to be applied to may be switched between the first and second reset gate electrodes 93 and 94. When the pulse voltage ΦR is at a high level thereof, a potential is set in such a manner as a solid line in illustrated in FIG. 22C or FIG. 22D, whereas when the pulse voltage ΦR is at a low level thereof, a potential is set in such a manner as a broken line in illustrated in FIG. 22C or FIG. 22D.

A potential in a channel located below a reset gate electrode can be gradually increased or decreased towards the reset drain 10 by varying an impurity profile and/or a thickness of a gate insulating film in a direction in which charges are transferred.

In the above-mentioned embodiments, electrons are transferred as charges. However, it should be noted that the above-mentioned embodiments can be applied to holes as charges, if an n-type impurity is replaced with a p-type impurity, and a voltage is applied to the charge transfer device in an opposite direction.

In addition, a method of inputting a bias charge is not to be limited to the above-mentioned ones. The other methods such as those described in the above-mentioned books, "Solid-State Image Sensor" and "Solid-State Imaging, with Charge-Coupled Devices", may be employed.

In the above-mentioned embodiments, the floating diffusion region 11 is of a heavily doped n-type region. However, the floating diffusion region 11 may be of an n-type region partially containing a heavily doped n-type (n⁺) region, to thereby reduce a capacity of a floating diffusion region. This can be applied to a floating diffusion amplifier.

In accordance with the present invention, it is possible to reset an n⁺ floating diffusion region to a predetermined potential, if a potential in a channel located below a reset gate electrode is not higher than a voltage in a reset drain when the n⁺ floating diffusion region is reset. Hence, it is no longer necessary to put a margin into a pulse voltage to be applied to a reset gate electrode. Accordingly, it is possible to reduce an amplitude of a voltage for driving a charges transfer device without deterioration of a yield of the device.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-135457 filed on May 26, 1997 including specification, claims, drawings and summary is incorporated herein by reference in its entirety.

What is claimed is:

1. A charge transfer device comprising:
   (a) a charge transfer channel for transferring signal charges therethrough;
   (b) a floating diffusion region for accumulating therein charges transferred from said charge transfer channel;
   (c) a field effect transistor for resetting said floating diffusion region so that said floating diffusion region is at a predetermined potential; and
   (d) a bias charge input section through which a bias charge is supplied and which is connected to one of said charge transfer channel and said floating diffusion region,
   said field effect transistor including a first reset gate electrode and a resect drain,
   a reset channel located below said first reset gate electrode being designed to receive a potential lower than a potential of said reset drain when said floating diffusion region is reset in the case that charges to the transferred are electrons, and a potential higher than a potential of said reset drain when said floating diffusion region is reset in the case that charges to be transferred are holes.

2. The charge transfer device as set forth in claim 1, wherein said bias charge input section is comprised of an input impurity diffusion region, an input impurity floating diffusion region, a first input gate electrode, and a second input gate electrode,
   said second input gate electrode being formed in connection with said charge transfer channel, said first input gate electrode being formed above a portion of a substrate sandwiched between said input impurity diffusion region and said input impurity floating diffusion region, and said second input gate electrode being formed above a portion of a substrate located adjacent to said input impurity floating diffusion region.

3. The charge transfer device as set forth in claim 1, wherein said charge transfer device includes an output gate electrode located adjacent to said floating diffusion region, and wherein said bias charge input section is connected to said charge transfer channel in the vicinity of said output gate electrode.

4. The charge transfer device as set forth in claim 3, wherein said bias charge input section is comprised of an input impurity diffusion region, an input impurity floating diffusion region, a first input gate electrode, a second input gate electrode, and a third input gate electrode,
   said third input gate electrode being formed in connection with said charge transfer channel, said first input gate electrode being formed above a portion of a substrate sandwiched between said input impurity diffusion region and said input impurity floating diffusion region, said second input gate electrode being formed above a portion of a substrate located adjacent to said input impurity floating diffusion region, and said third input gate electrode being formed adjacent to said second input gate electrode.

5. The charge transfer device as set forth in claim 3, wherein a well region in which said charge transfer channel is formed bifurcates, and wherein said bias charge input section is formed in a bifurcation of said well region.

6. The charge transfer device as set forth in claim 5, wherein said charge transfer device includes a plurality of transfer electrodes arranged in a row below which said charge transfer channel is to be formed, and wherein said well region bifurcates at a transfer electrode in said row.

7. The charge transfer device as set forth in claim 6, wherein said transfer electrode located at which said well region bifurcates is designed to be larger in size than the other transfer electrodes.

8. The charge transfer device as set forth in claim 1, wherein said bias charge input section is connected to said floating diffusion region, and wherein said bias charge input section is comprised of an input impurity diffusion region, an input impurity floating diffusion region, a first input gate electrode, a second input gate electrode, a third input gate electrode, and a fourth input gate electrode,
   said fourth input gate electrode being formed in connection with said floating diffusion region, said first input gate electrode being formed above a portion of a substrate sandwiched between said input impurity diffusion region and said input impurity floating diffusion region, said second input gate electrode being formed above a portion of a substrate located adjacent to said input impurity floating diffusion region, said third input gate electrode being formed adjacent to said second input gate electrode, and said fourth input gate electrode being formed adjacent to said third input gate electrode.

9. The charge transfer device as set forth in claim 1, wherein said charge transfer device has a plurality of transfer electrodes arranged in a row below which said charge transfer channel is to be formed,
   wherein a first pulse voltage is applied to first pairs of transfer electrodes and a second pulse voltage is applied to second pairs of transfer electrodes, said first and second pairs of transfer electrodes being alternately arranged in a row, and
   wherein a third pulse voltage is applied to third pairs of transfer electrodes and a fourth pulse voltage is applied to fourth pairs of transfer electrodes, said third and fourth pairs of transfer electrodes being alternately arranged in a row,
   said first, second, third and fourth pairs of transfer electrodes being arranged in a row.

10. The charge transfer device as set forth in claim 9, wherein said third and fourth pulse voltages have a frequency twice greater than a frequency of said first and second pulse voltages.

11. The charge transfer device as set forth in claim 9, wherein said bias charge input section is comprised of an input impurity diffusion region, an input impurity floating diffusion region, a first input gate electrode, a second input gate electrode, and a third input gate electrode,
   said third input gate electrode being formed in connection with said charge transfer channel, said first input gate electrode being formed above a portion of a substrate sandwiched between said input impurity diffusion region and said input impurity floating diffusion region, said second input gate electrode being formed above a portion of a substrate located adjacent to said input impurity floating diffusion region, and said third input gate electrode being formed adjacent to said second input gate electrode.

12. The charge transfer device as set forth in claim 9, wherein a well region in which said charge transfer channel is formed bifurcates, and wherein said bias charge input section is formed in a bifurcation of said well region.

13. The charge transfer device as set forth in claim 12, wherein said well region bifurcates at a transfer electrode to which said fourth pulse voltage is applied.

14. The charge transfer device as set forth in claim 13, wherein said transfer electrode located at which said well region bifurcates is designed to be larger in size than the other transfer electrodes.

15. The charge transfer device as set forth in claim 1, wherein signal charges are input to said charge transfer channel upstream of a connection of said bias charge input section to said charge transfer channel.

16. The charge transfer device as set forth in claim 1, wherein said bias charge is input through said bias charge input section to one of said charge transfer channel and said floating diffusion region.

17. The charge transfer device as set forth in claim 1, wherein a sum of said signal charge and said bias charge is transferred to said floating diffusion region.

18. The charge transfer device as set forth in claim 1, wherein said signal charge and said bias charge are concurrently transferred to said floating diffusion region.

19. The charge transfer device as set forth in claim 1, wherein said signal charge and said bias charge are alternately transferred to said floating diffusion region.

20. The charge transfer device as set forth in claim 1, wherein said bias charge has an magnitude sufficient to vary a potential of said floating diffusion region by 40 mV or greater.

21. A charge transfer device comprising:
 (a) a charge transfer channel for transferring signal charges therethrough;
 (b) a floating diffusion region for accumulating therein charges transferred from said charge transfer channel;
 (c) a field effect transistor for resetting said floating diffusion region so that said floating diffusion region is at a predetermined potential; and
 (d) a bias charge input section through which a bias charge is supplied and which is connected to one of said charge transfer channel and said floating diffusion region,
 said field effect transistor including a first reset gate electrode, a second reset gate electrode located adjacent to said first reset gate electrode in a direction in which said charges are transferred, and a reset drain,
 a reset channel located below at least one of said first and second reset gate electrodes, being designed to receive a potential lower than a potential of said reset drain when said floating diffusion region is reset in the case that charges to be transferred are electrons, and a potential higher than a potential of said reset drain when said floating diffusion region is reset in the case that charges to be transferred are holes.

22. The charge transfer device as set forth in claim 21, wherein said first and second reset gate electrodes have the same channel configuration located therebeneath, the same structure of a gate insulating film, and the same impurity profile.

23. The charge transfer device as set forth in claim 21, wherein said reset channels located below said first and second reset gate electrodes have the same potential when the same voltage is applied to said first and second reset gate electrodes.

24. The charge transfer device as set forth in claim 21, wherein one of said reset channels located below said first and second reset gate electrodes has a potential having an inclination in a direction in which charges are transferred.

25. The charge transfer device as set forth in claim 21, wherein one of said reset channels located below said first and second reset gate electrodes is designed to have a width increasing or decreasing in a direction in which charges are transferred.

26. The charge transfer device as set forth in claim 21, wherein a predetermined voltage is applied to one of said first and second reset gate electrodes, and a voltage switched at a predetermined timing between high and low levels is applied to the other.

27. The charge transfer device as set forth in claim 21, wherein signal charges are input to said charge transfer channel upstream of a connection of said bias charge input section to said charge transfer channel.

28. The charge transfer device as set forth in claim 21, wherein said bias charge is input through said bias charge input section to one of said charge transfer channel and said floating diffusion region.

29. The charge transfer device as set forth in claim 21, wherein a sum of said signal charge and said bias charge is transferred to said floating diffusion region.

30. The charge transfer device as set forth in claim 21, wherein said signal charge and said bias charge are concurrently transferred to said floating diffusion region.

31. The charge transfer device as set forth in claim 21, wherein said signal charge and said bias charge are alternately transferred to said floating diffusion region.

32. The charge transfer device as set forth in claim 21, wherein said bias charge has an magnitude sufficient to vary a potential of said floating diffusion region by 40 mV or greater.

33. The charge transfer device as set forth in claim 21, wherein said reset channel to be formed below said first reset gate electrode is different in configuration from said reset channel to be formed below said second reset gate electrode.

34. The charge transfer device as set forth in claim 21, wherein a gate insulating film under said first reset gate electrode is different in structure from a gate insulating film under said second reset gate electrode.

35. The charge transfer device as set forth in claim 21, wherein an impurity profile below said first reset gate electrode is different from an impurity profile below said second reset gate electrode.

36. The charge transfer device as set forth in claim 21, wherein an impurity profile below one of said first and second reset gate electrodes is designed to vary in a direction in which said charges are transferred.

37. The charge transfer device as set forth in claim 21, wherein a gate insulating film under one of said first and second reset gate electrodes is designed to have a thickness increasing or decreasing in a direction in which said charges are transferred.

38. The charge transfer device as set forth in claim 21, wherein said reset channel channel located below one of said first and second reset gate electrodes is designed to have a different potential from a potential of said reset channel located below the other reset gate electrode when the same voltage is applied to said first and second reset gate electrodes.

39. The charge transfer device as set forth in claim 21, wherein said reset channel located below at least one of said first and second reset gate electrodes is designed to have a lower potential than a potential of said reset drain when said floating diffusion region is reset in the case that charges to be transferred are electrons, and have a higher potential than a potential of said reset drain when said floating diffusion region is reset in the case that charges to be transferred are holes.

40. The charge transfer device as set forth in claim 21, wherein a potential of said reset drain is intermediate between potentials of said reset channels located below said first and second reset gate electrodes, when said floating diffusion region is reset.

41. The charge transfer device as set forth in claim 21, wherein a higher level of a pulse voltage to be applied to one of said first and second reset gate electrodes is set higher than a voltage applied to the other in the case that charges to be transferred are electrons, and a lower level of a pulse voltage to be applied to one of said first and second reset gate electrodes is set lower than a voltage applied to the other in the case that charges to be transferred are holes.

42. The charge transfer device as set forth in claim 21, wherein said reset channels located below said first and second reset gate electrodes are designed to have different dimensions from each other such thatpotentials of said reset channels are different from each other when the same voltage is applied to said first and second reset gate electrodes.

43. The charge transfer device as set forth in claim 21, wherein insulating films located under said first and second reset gate electrodes are designed to have different structures from each other such that potentials of said reset channels are different from each other when the same voltage is applied to said first and second reset gate electrodes.

44. The charge transfer device as set forth in claim 21, wherein impurity profiles located below said first and second reset gate electrodes are designed to be different from each other such that potentials of said reset channels are different from each other when the same voltage is applied to said first and second reset gate electrodes.

45. The charge transfer device as set forth in claim 21, wherein said bias charge input section is comprised of an input impurity diffusion region, an input impurity floating diffusion region, a first input gate electrode and a second input gate electrode, said second input gate electrode being formed in connection with said charge transfer channel, said first input gate electrode being formed above a portion of a substrate sandwiched between said input impurity diffusion region and said input impurity floating diffusion region, and said second input gate electrode being formed above a portion of a substrate located adjacent to said input impurity floating diffusion region.

46. The charge transfer device as set forth in claim 21, wherein said charge transfer device includes an output gate electrode located adjacent to said floating diffusion region, and wherein said bias charge input section is connected to said charge transfer channel in the vicinity of said output gate electrode.

47. The charge transfer device as set forth in claim 46, wherein said bias charge input section is comprised of an input impurity diffusion region, an input impurity floating diffusion region, a first input gate electrode, a second input gate electrode, and a third input gate electrode, said third input gate electrode being formed in connection with said charge transfer channel, said first input gate electrode being formed above a portion of a substrate sandwiched between said input impurity diffusion region and said input impurity floating diffusion region, said second input gate electrode being formed above a portion of a substrate located adjacent to said input impurities floating diffusion region, and said third input gate electrode being formed adjacent to said second input gate electrode.

48. The charge transfer device as set forth in claim 46, wherein a well region in which said charge transfer channel is formed bifurcates, and wherein said bias charge input section is formed in a bifurcation of said well region.

49. The charge transfer device as set forth in claim 48, wherein said charge transfer device includes a plurality of transfer electrodes arranged in a row below which said charge transfer channel is to be formed, and wherein said well region bifurcates at a transfer electrode in said row.

50. The charge transfer device as set forth in claim 49, wherein said transfer electrode located at which said well region bifurcates is designed to be larger in size than the other transfer electrodes.

51. The charge transfer device as set forth in claim 21, wherein said bias charge input section is connected to said floating diffusion region, and wherein said bias charge input section is comprised of an input impurity diffusion region, an input impurity floating diffusion region, a first input gate electrode, a second input gate electrode, a third input gate electrode, and a fourth input gate electrode, said fourth input gate electrode being formed in connection with said floating diffusion region, said first input gate electrode being formed above a portion of a substrate sandwiched between said input impurity diffusion region and said input impurity floating diffusion region, said second input gate electrode being formed above a portion of a substrate located adjacent to said input impurity floating diffusion region, said third input gate electrode being formed adjacent to said second input gate electrode, and said fourth input gate electrode being formed adjacent to said third input gate electrode.

52. The charge transfer device as set forth in claim 21, wherein said charge transfer device a plurality of transfer electrode arranged in a row below which said charge transfer channel is to be formed, wherein a first pulse voltage is applied to first pairs of transfer electrodes and a second pulse voltage is applied to second pairs of transfer electrodes, said first and second pairs of transfer electrodes being alternately arranged in a row, and wherein a third pulse voltage is applied to third pairs of transfer electrodes and a fourth pulse voltage is applied to fourth pairs of transfer electrodes, said third and fourth pairs of transfer electrodes being alternately arranged in a row, said first, second, third and fourth pairs of transfer electrodes being arranged in a row.

53. The charge transfer device as set forth in claim 52, wherein said third and fourth pulse voltages have a frequency twice greater than a frequency of said first and second pulse voltages.

54. The charge transfer device as set forth in claim 52, wherein said bias charge input section is comprised of an input impurity diffusion region, an input impurity floating diffusion region, a first input gate electrode, a second input gate electrode, and a third input gate electrode, said third input gate electrode being formed in connection with said charge transfer channel, said first input gate electrode being formed above a portion of a substrate sandwiched between said input impurity diffusion region and said input impurity floating diffusion region, said second input gate electrode being formed above a portion of a substrate located adjacent to said input impurity floating diffusion region, and said third input gate electrode being formed adjacent to said second input gate electrode.

55. The charge transfer device as set forth in claim 52, wherein a well region in which said charge transfer channel is formed bifurcates, and wherein said bias charge input section is formed in a bifurcation of said well region.

56. The charge transfer device as set forth in claim 55, wherein said well region bifurcates at a transfer electrode to which said fourth pulse voltage is applied.

57. The charge transfer device as set forth in claim 56, wherein said transfer electrode located at which said well region bifurcates is designed to be larger in size than the other transfer electrodes.

58. A method of driving a charge transfer device, said charge transfer device comprising:
   (a) a charge transfer channel for transferring signal charges therethrough;
   (b) a floating diffusion region for accumulating therein charges transferred from said charge transfer channel;
   (c) a field effect transistor for resetting said floating diffusion region so that said floating diffusion region is at a predetermined potential; and
   (d) a bias charge input section through which a bias charge is supplied and which is connected to one of said charge transfer channel and said floating diffusion region,
   said field effect transistor including at least one reset gate electrode and a reset drain,
   a reset channel located below said reset gate electrode being designed to receive a potential lower than a potential of said reset drain when said floating diffusion region is reset in the case that charges to be transferred are electrons, and a potential higher than a potential of said reset drain when said floating diffusion region is reset in the case that charges to be transferred are holes,
   said method comprising one of the following steps of
   (a) transferring a sum of said signal and bias charges to said floating diffusion region;
   (b) transferring said signal and bias charges concurrently to said floating diffusion region;
   (c) alternately transferring said signal charge and a bias charge to said floating diffusion region; and
   (d) applying a bias charge to said charge transfer device sufficiently to vary a potential of said floating diffusion region by 40 mV or greater.

59. The method as set forth in claim 58, further comprising the step of resetting said floating diffusion region after both said signal and bias charges are transferred to said floating diffusion region.

60. The method as set forth in claim 58, wherein said charge transfer device has a plurality of transfer electrodes arranged in a row below which said charge transfer channel is to be formed,
   wherein a first pulse voltage is applied to first pairs of transfer electrodes and a second pulse voltage is applied to second pairs of transfer electrodes, said first and second pairs of transfer electrodes being alternately arranged in a row, and
   wherein a third pulse voltage is applied to third pairs of transfer electrodes and a fourth pulse voltage is applied to fourth pairs of transfer electrodes, said third and fourth pairs of transfer electrodes being alternately arranged in a row,
   said first, second, third and fourth pairs of transfer electrodes being arranged in a row,
   wherein said third and fourth pulse voltages have a frequency twice greater than a frequency of said first and second pulse voltages.

61. The method as set forth in claim 59, wherein said charge transfer device has a plurality of transfer electrodes arranged in a row below which said charge transfer channel is to be formed,
   wherein a first pulse voltage is applied to first pairs of transfer electrodes and a second pulse voltage is applied to second pairs of transfer electrodes, said first and second pairs of transfer electrodes being alternately arranged in a row, and
   wherein a third pulse voltage is applied to third pairs of transfer electrodes and a fourth pulse voltage is applied to fourth pairs of transfer electrodes, said third and fourth pairs of transfer electrodes being alternately arranged in a row,
   said first, second, third and fourth pairs of transfer electrodes being arranged in a row,
   wherein said third and fourth pulse voltages have a frequency twice greater than a frequency of said first and second pulse voltages.

* * * * *

UNITED STATES PATENT AND TRADEMARK OFFICE
CERTIFICATE OF CORRECTION

PATENT NO. : 6,157,053
DATED : December 5, 2000
INVENTOR(S) : Tanabe

Page 1 of 1

It is certified that error appears in the above-identified patent and that said Letters Patent is hereby corrected as shown below:

Column 27,
Line 26, insert a space between "that" and "potentials".

Column 28,
Line 6, change "impurities" to -- impurity --.

Signed and Sealed this

Seventh Day of May, 2002

Attest:

JAMES E. ROGAN
Attesting Officer     Director of the United States Patent and Trademark Office